United States Patent

Yagyu et al.

[11] Patent Number: 6,150,808
[45] Date of Patent: Nov. 21, 2000

[54] SWITCHING APPARATUS HAVING MAGNETORESISTIVE ELEMENTS FOR DETECTING A PLURALITY OF MANUALLY SELECTED SWITCHING POSITION

[75] Inventors: Hiroshi Yagyu, Tsushima; Koichi Sato, Anjo; Makoto Ito, Handa; Kenichi Ao, Tokoi, all of Japan

[73] Assignees: Denso Corporation, Kariya; Anden Co., Ltd., Anjo, both of Japan

[21] Appl. No.: 08/822,925

[22] Filed: Mar. 21, 1997

[30]  Foreign Application Priority Data

Mar. 21, 1996 [JP] Japan .................................. 8-064896

[51] Int. Cl.⁷ .............................. G01B 7/14; G01B 7/30; H01H 13/64; H01L 43/08
[52] U.S. Cl. ................................ 324/207.21; 324/207.22; 335/205
[58] Field of Search ............................ 324/207.2, 207.21, 324/226, 207.26, 207.22; 335/205, 207; 338/32 R, 32 H; 200/19.36

[56]  References Cited

U.S. PATENT DOCUMENTS

| | | |
|---|---|---|
| 4,216,458 | 8/1980 | Edwards ..................................... 338/32 |
| 4,791,365 | 12/1988 | Johannes et al. ......................... 324/208 |
| 4,835,509 | 5/1989 | Yoshino et al. . |
| 4,868,530 | 9/1989 | Ahs ......................................... 335/207 |
| 5,142,225 | 8/1992 | Gerlach et al. ..................... 324/207.21 |
| 5,359,287 | 10/1994 | Watanabe et al. . |
| 5,570,015 | 10/1996 | Takaishi et al. ................... 324/207.21 |
| 5,646,587 | 7/1997 | Miyazawa et al. ..................... 335/207 |

FOREIGN PATENT DOCUMENTS 2-040819 2/1990 Japan .
2-040820 2/1990 Japan .

Primary Examiner—Walter E. Snow
Attorney, Agent, or Firm—Pillsbury Madison & Sutro LLP

[57]  ABSTRACT

A switching apparatus is provided which may be used for power window control systems of automotive vehicles. The switching apparatus includes an operating knob, a magnet, a magnetoresistive element, and a position determining circuit. The operating knob is manually shifted between a plurality of switching positions. The magnet moves according to the movement of the operating knob. The magnetoresistive element is placed in a magnetic field applied from the magnet and changes an electrical resistance thereof according to a variation in orientation of a magnetic flux applied to the magnetoresistive element resulting from the movement of the magnet. The position determining circuit monitors a change in electric resistance of the magnetoresistive element to determine the switching position of the operating member.

17 Claims, 27 Drawing Sheets

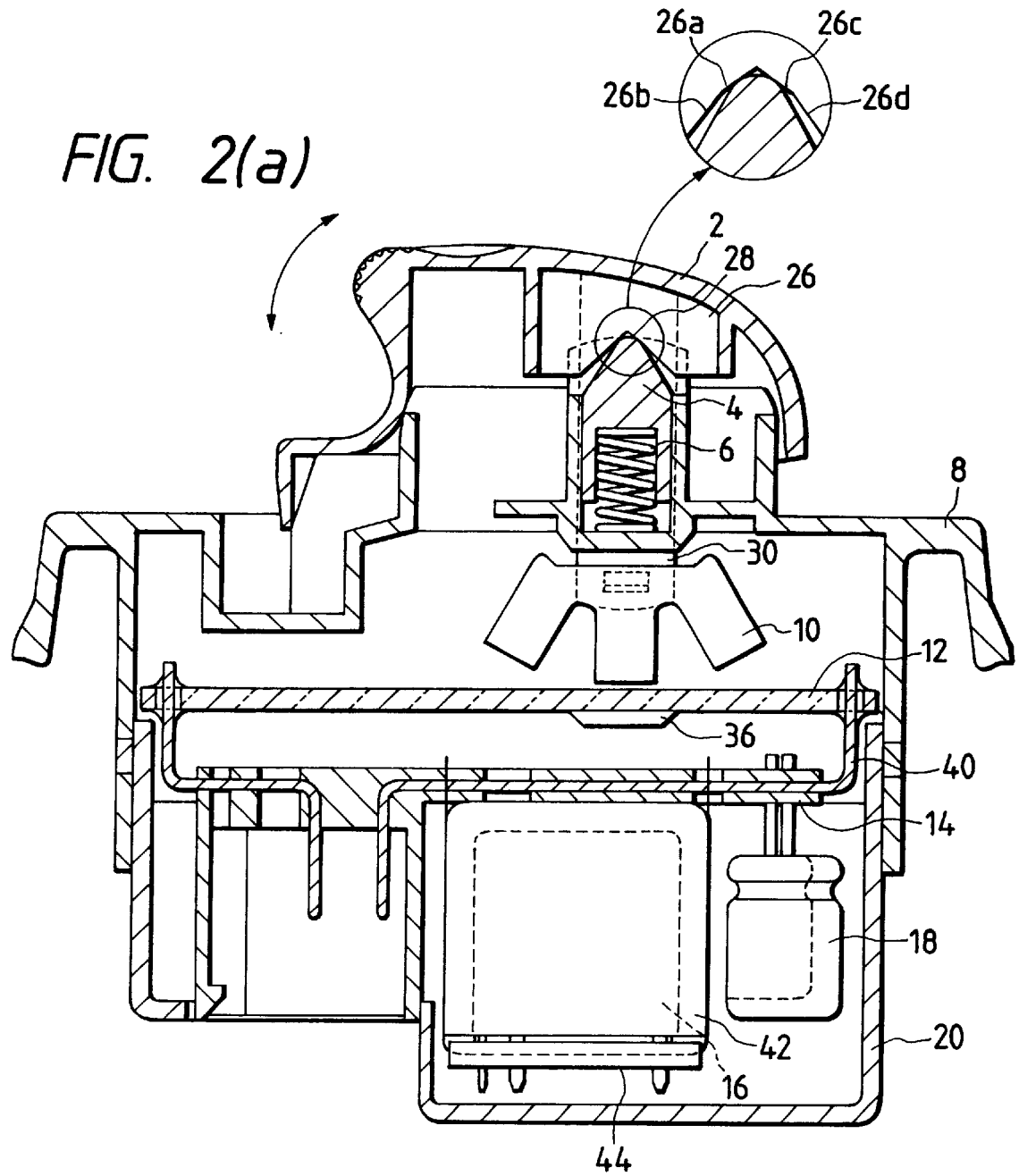

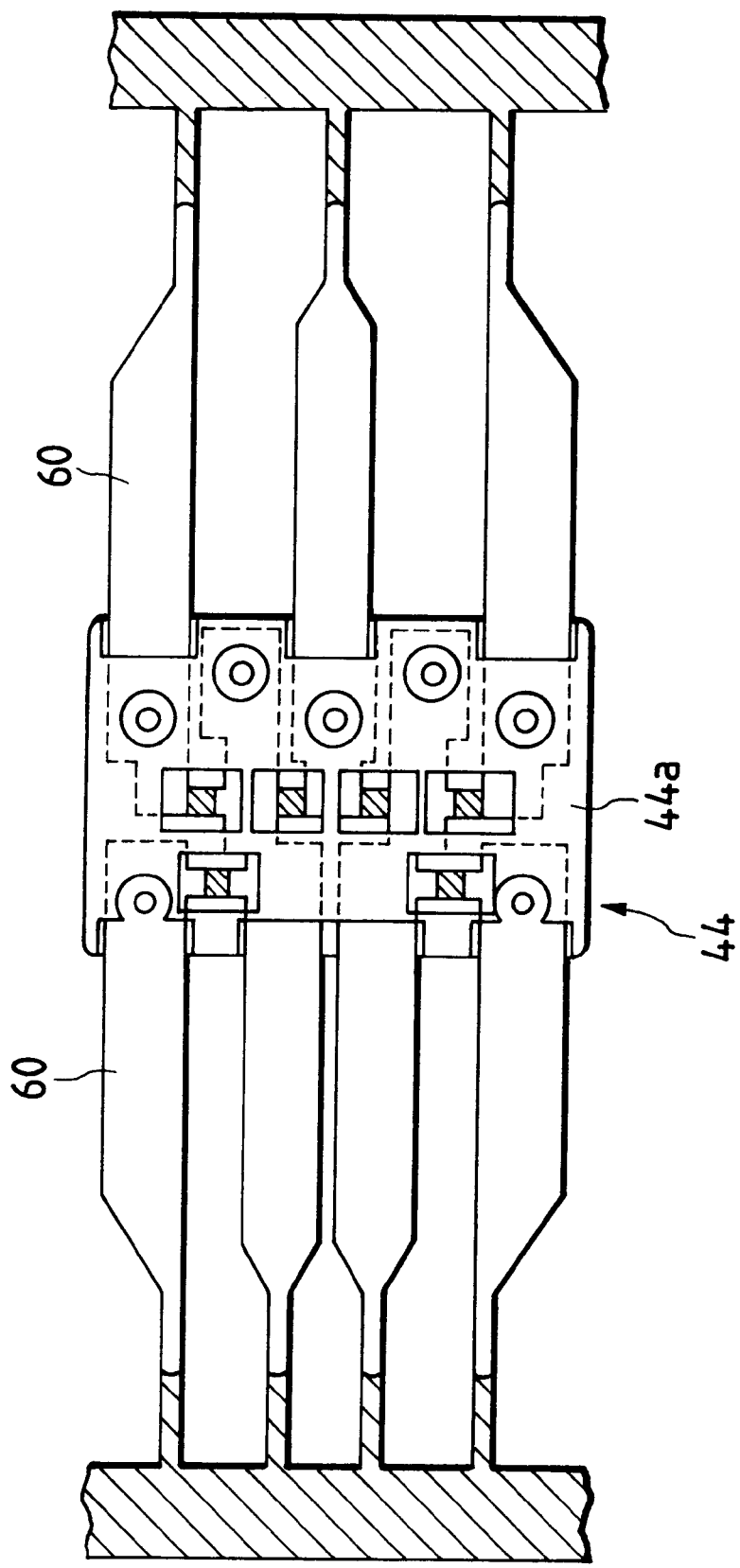

FIG. 25

TABLE 1

| | TERMINAL A | TERMINAL B | TERMINAL C | TERMINAL D | TERMINAL E | TERMINAL F |
|---|---|---|---|---|---|---|
| 1st BRIDGE C.K.T. | TO GROUND | TO COMPARATOR 112 | 5V | OPENED | OPENED | OPENED |
| 2nd BRIDGE C.K.T. | OPENED | 5V | TO COMPARATOR 113 | TO GROUND | OPENED | OPENED |
| 3rd BRIDGE C.K.T. | OPENED | OPENED | 5V | TO COMPARATOR 114 | TO GROUND | OPENED |
| 4th BRIDGE C.K.T. | OPENED | OPENED | OPENED | 5V | TO COMPARATOR 115 | TO GROUND |

FIG. 26

TABLE 2

|  | 1st STORAGE | 2nd STORAGE | 3rd STORAGE | 4th STORAGE |
|---|---|---|---|---|
| AUTO UP | H | H | H | H |
| MANUAL UP | L | H | H | H |
| STOP | L | L | H | H |
| MANUAL DOWN | L | L | L | H |
| AUTO DOWN | L | L | L | L |

H : HIGH-LEVEL SIGNAL
L : LOW-LEVEL SIGNAL

SWITCHING APPARATUS HAVING MAGNETORESISTIVE ELEMENTS FOR DETECTING A PLURALITY OF MANUALLY SELECTED SWITCHING POSITION

BACKGROUND OF THE INVENTION

1. Technical Field

The present invention relates generally to an improved structure of a switching apparatus designed to detect a plurality of manually selected switching positions, and more particularly to a switching apparatus which may be employed in controlling operational modes of a power window control system for automotive vehicles.

2. Background of Related Art

There have been proposed different types of switching devices for use in a power window control system for automotive vehicles, one of which is taught in Japanese Patent First Publication No. 2-40819. The switching devices have a mechanism which closes electrical contacts directly in response to movement of a manual operating knob.

Such contact switching devices, however, has the drawback in that the operational reliability thereof may fall due to dust.

SUMMARY OF THE INVENTION

It is therefore a principal object of the present invention to avoid the disadvantages of the prior art.

It is another object of the present invention to provide a non-contact type switching device designed to detect the position of an operating member in a non-contact fashion and provide a signal indicative thereof.

According to one aspect of the present invention, there is provided a switching apparatus which comprises: (a) an operating member moving within a preselected operational range; (b) a magnet moving according to the movement of the operating member; (c) a magnetoresistive element placed in a magnetic field applied from the magnet, the magnetoresistive element changing an electrical resistance thereof according to a variation in orientation of a magnetic flux applied to the magnetoresistive element resulting from the movement of the magnet; and (d) a position determining circuit measuring a change in electric resistance of the magnetoresistive element to determine a position of the operating member within the given operational range and providing a signal indicative thereof.

In the preferred mode of the invention, the preselected operational range of the operating member is so defined that the electric resistance of the magnetoresistive element is changed substantially in a linear fashion according to the variation in orientation of the magnetic flux applied to the magnetoresistive element.

The operating member moves along a given path of travel which changes an angle between the magnetoresistive element and the magnetic flux according to the movement of the magnet.

The magnetoresistive element includes first and second magnetoresistors which are connected in series to make up a bridge circuit so that resistances of the first and second magnetoresistors are changed in opposite directions according to the movement of the magnet.

The first and second magnetoresistors are so connected that when an angle between the magnetic flux and the first magnetoresistor is increased according to the movement of the magnet, and vice versa, an angle between the magnet flux and the second magnetoresistor is decreased, and vice versa.

The magnet includes first, second, and third magnetic portions, the first and second magnetic portions being magnetized to have one of north and south poles, the third magnetic portion being magnetized to have the other of the north and south poles.

The magnetoresistive element may include first and second magnetoresistors which are connected in series to make up a bridge circuit. The position determining circuit measures an electric potential appearing at a junction of the first and second magnetoresistors to determine the position of the operating member.

The position determining circuit compares the electric potential appearing at the junction of the first and second magnetoresistors with reference values to determine the position of the operating member. Each of the reference values corresponds to one of switching positions of the operating member which are preselected within the preselected operational range. The position determining circuit selects one from the switching positions at which the operating member lies based on results of comparison of the levels of the electric potentials with the reference values.

The magnetoresistive element may alternatively include a plurality of bridge circuits each of which develops a given level of electric potential in a preselected positional relation to the magnet. The position determining circuit determines the position of the operating member based on levels of the electric potentials developed at the bridge circuits. Specifically, the position determining circuit selects one from the bridge circuits which develops the given level of the electric potential to determine the position of the operating member.

The operating member is designed to be kept at given one of switching positions defined within the preselected operational range.

Each of the reference values is determined based on the electric potential developed at the magnetoresistive element when the operating member is in inoperative position.

Each of the reference values may alternatively be determined based on a difference between the electric potential developed at the magnetoresistive element when the operating member is in the operative position and the electric potential developed at the magnetoresistive element when the operating member reaches a given position within the preselected operational range.

A printed circuit board may be further provided which has the magnetoresistive element mounted on a first surface thereof opposite a second surface facing the magneto.

The printed circuit board has mounted on the second surface the position determining circuit.

According to another aspect of the invention, there is provided a power window control apparatus opening and closing a window which comprises: (a) an operating member moving within a preselected operational range; (b) a magnet moving according to the movement of the operating member; (c) a magnetoresistive element placed in a magnetic field applied from the magnet, the magnetoresistive element changing an electrical resistance thereof according to a variation in orientation of a magnetic flux applied to the magnetoresistive element resulting from the movement of the magnet; (d) a position determining circuit measuring the electric resistance of the magnetoresistive element to determine a position of the operating member within the given operational range and providing a signal indicative thereof; and (e) a control circuit responsive to the signal from the position determining circuit to control movement of the window.

In the preferred mode of the invention, the position determining circuit compares the electric resistance of the magnetoresistor with a plurality of reference values to determine the position of the operating member. The control circuit selects one from a plurality of operational modes according to a result of the comparison to control the movement of the window in the selected one of the operational modes.

The control circuit may alternatively control the speed of the movement of the window according to the selected one of the operational modes.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIG. 2(a) is a cross sectional view of the switching apparatus show in FIG. 1;

FIG. 2(b) is an expanded sectional view which shows a tip of a pin 4;

FIG. 4 is a plan view which shows a relay base 44 of a switching apparatus;

FIG. 5(c) is a bottom view of the magnet 10 shown in FIG. 5(a);

FIG. 25 is a table 1 which shows combinations of connections of terminals A to F of a magnetoresistive element when electric potentials at first to fourth bridge circuits are measured in sequence;

FIG. 26 is a table 2 which shows the relation between operational positions of a manual operating knob and logic levels stored in first to fourth storage circuits;

DESCRIPTION OF THE PREFERRED EMBODIMENT

Figure 1:
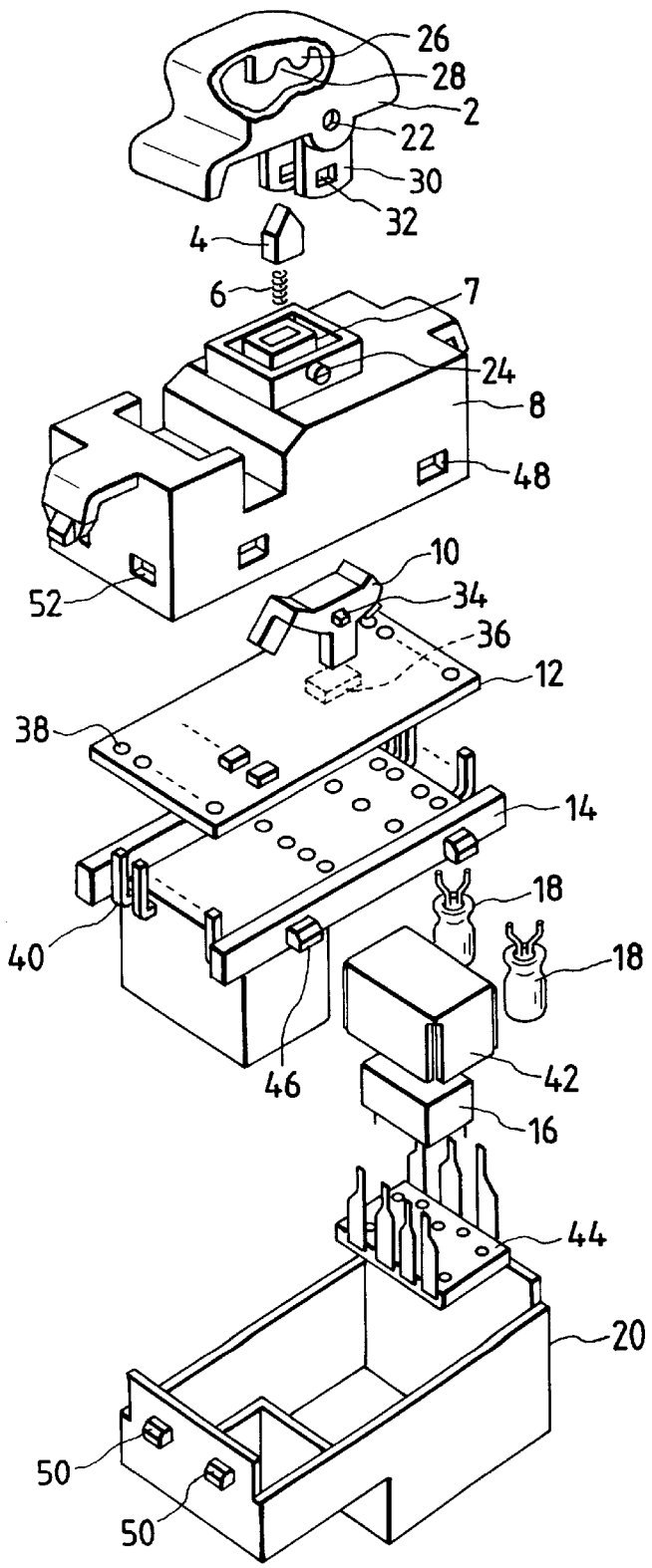
FIG. 1 is a perspective exploded view which shows a switching apparatus according to the invention.

Referring now to the drawings, particularly to FIG. 1, there is shown a switching apparatus according to the first embodiment of the invention.

The switching apparatus includes generally a manual operating knob 2, a support pin 4, a coil spring 6, a housing 8, a magnet 10, a printed circuit board 12, a base 12, a relay 16, and electrolytic capacitors 18, and a cover 20.

The manual operating knob 2 is, as clearly shown in the drawing, of cap-shape and has formed in its both side walls mounting holes 22. Pins 24 formed on the housing 8 engage the mounting holes 22 to pivotably retain the manual operating knob 2. The manual operating knob 2 has also formed on a central portion of a top inner wall thereof a protrusive plate 26. The protrusive plate 26 has formed in its end surface a C-shaped recess 28 with which the pin 4 is urged by the spring 6 into constant engagement. The pin 4 is disposed within a box 7 formed on a central portion of a top wall of the housing 8.

The pin 4, as clearly shown in FIG. 2(b), tapers off and has a rounded tip. The recess 28 of the protrusive plate 26 of the manual operating knob 2 has two pairs of tapered surfaces 26a to 26d which are brought into contact with the tip of the pin 4 according to the movement of the manual operating knob 2, as shown by an arrow in FIG. 2(a), to establish five manually selected switching positions (hereinafter, referred to as first to fifth operational positions).

Specifically, the first operational position is an off-position wherein the pin 4 is held between the tapered surfaces 26a and 26c. The second operational position is established by turning the manual operating knob 2 in the clockwise direction, as viewed in the drawing, using a finger of an operator to bring the tip of the pin 4 into engagement between the tapered surfaces 26a and 26b. The third operational position is established by turning the manual operating knob 2 further in the clockwise direction from the second operational position against the spring force of the spring 6 until the manual operating knob 2 hits the housing 8. The fourth operational position is established by turning the manual operating knob 2 in the counterclockwise direction from the first operational position to bring the tip of the pin 4 into engagement between the tapered surfaces 26c and 26d. The fifth operational position is established by turning the manual operating knob 2 further in the counterclockwise direction from the fourth operational position against the spring force of the spring 6 until the manual operating knob 2 hits the housing 8.

Upon release of holding of the manual operating knob 2 by the finger of the operator, the second to fifth operational positions are returned automatically back to the first operational position with aid of the spring force of the spring 6.

The manual operating knob 2 also has formed on both side portions of the top inner wall thereof a pair of plate arms 30. The plate arms 30 extend downward, as viewed in the drawings, through the upper wall of the housing 8 and engage at rectangular holes 32 thereof protrusions 34 formed on upper portions of side walls of the magnet 10. Therefore, the rotational movement of the manual operating knob 2 in the direction as indicated by the arrow in FIG. 2(a) causes the plate arms 30 to be swung about the pivot of the manual operating knob 2 to move the magnet 10.

The printed circuit board 12 is disposed beneath the magnet 10 and has mounted on an upper surface thereof circuit elements of a detection circuit 100 and a motor driver 200, as will be described later in detail with reference to FIG. 16. The printed circuit board 12 also has a magnetoresistive element (MRE) 36 mounted on a lower surface thereof opposite the magnet 10. The MRE 36 changes a value of resistance thereof according to the rotational movement of the magnet 10 or application of a magnetic field and provides a signal indicating the position of the magnet 10 (i.e., the position of the manual operating knob 2).

The printed circuit board 12 has formed therein a plurality of holes 38. Terminals 40 projecting from the base 14 pass through the holes 38 and are soldered to the printed circuit board 12.

Figure 3A:
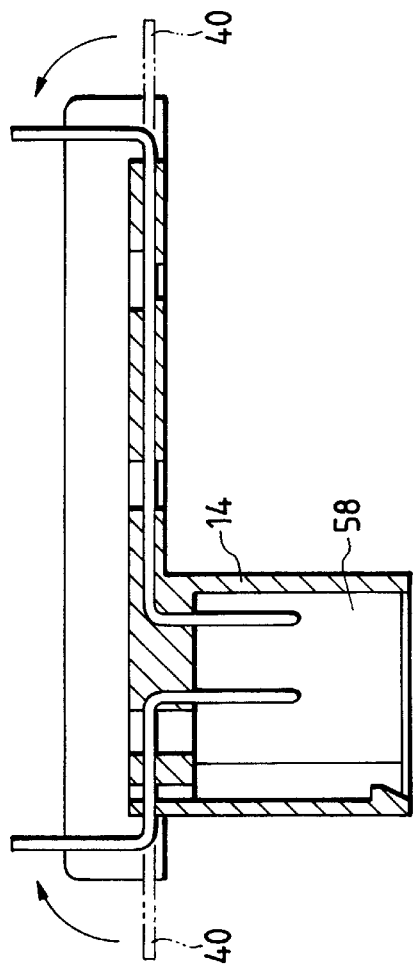
FIG. 3(a) is a cross sectional view of FIG. 3(b)
Figure 3B:
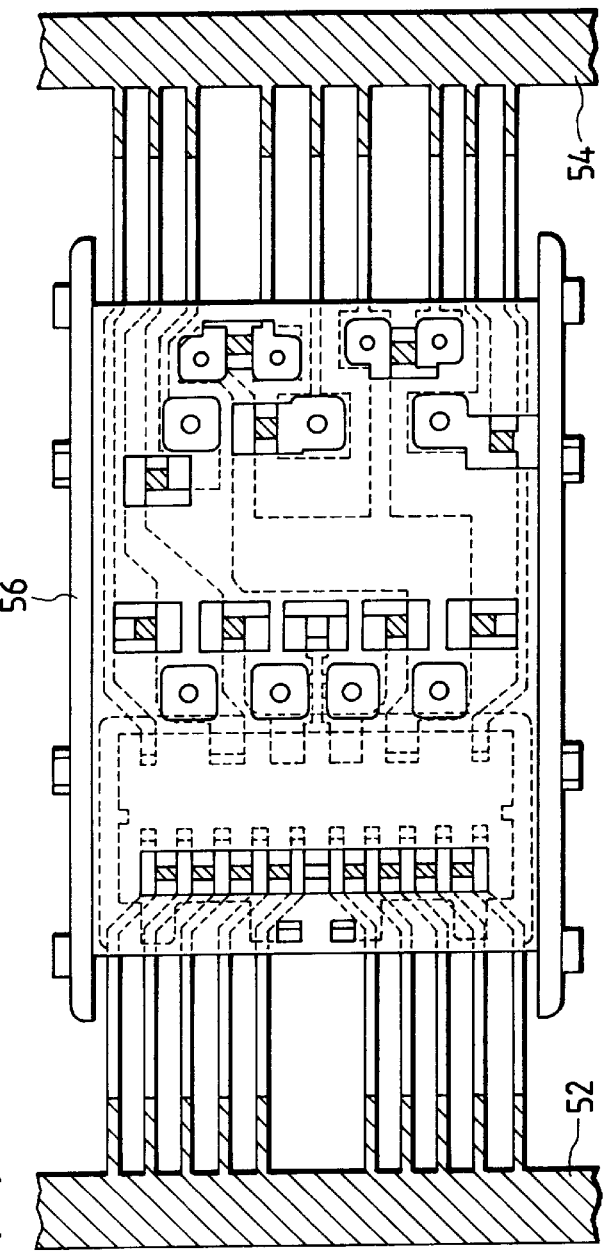
FIG. 3(b) is a plan view which shows a base 14 of a switching apparatus.

The base 14 is fabricated in the following manner. First, conductive plates 52 and 54, as shown in FIG. 3(b) are formed by stamping out two plates from a conductive plate such as a tinned brass plate and bending them into desired shapes, respectively. Next, a base plate 56 is formed in the insert molding by inserting the conductive plates 52 and 54 into a heat resistant resin provided in upper and lower molds, such as PPS (PolyPhenylen Sulfide) which can resist heat produced during soldering. Finally, hatched areas are cut out from portions of the conductive plates 52 and 54 extending from the base plate 56, and these extensions are bent vertically to form L-shaped terminals 40, as shown in FIG. 3(a), which have flexibility for absorbing stress acting on soldered portions thereof due to the difference in thermal expansion between the printed circuit board 12 and the base 14.

The electrolytic capacitors 18 and the relay 16 are soldered to conductive portions of the base 14. The relay 16 is, as shown in FIGS. 1 and 2, soldered to a relay base 44. A cover 42 made of urethan foam is wound around and attached to the relay 16 by adhesive for reducing mechanical noise generated from the relay 16 upon operation.

The relay base 44 is fabricated in the following manner. First, spring plates 60, as shown in FIG. 4, are formed by stamping out two plates from a metallic plate made of phosphor bronze or beryllium copper into desired patterns. A base plate 44a is formed in the insert molding by inserting the spring plates 60 into a resin material (e.g., PPS) provided in a mold. Finally, hatched areas are cut out from the spring plates 60 to form terminals which have flexibility for absorbing vibrations produced by the operation of the relay 16 to reduce transmission of operating sound of the relay 16 to other parts.

The base 14 has, as shown in FIG. 1, formed on side walls thereof four protrusions 46 which engage rectangular openings 48 formed in side walls of the housing 8 to secure the housing 8 to the base 14.

The cover 20 has formed on end walls thereof four protrusions 50 which engage rectangular openings 52 formed in end walls of the housing 8 to secure the cover 20 to the housing 8.

In operation, the swing motion of the manual operating knob 2 in the direction as indicated by the arrow in FIG. 2 causes the magnet 10 to be swung about the pivot defined by the pins 34 formed on the housing 8. The swing motion of the magnet 10 causes the resistance of the MRE 36 to be changed. The detection circuit 100, as will be described later in detail, determines the position of the manual operating knob 2 based on a change in resistance of the MRE 36 to control an electric motor for a power window of an automotive vehicle, for example.

The magnet 10 is formed with a plastic magnet made of a mixture of resin and magnetic fillers made of ferrite material. This is because the plastic magnet has usually a higher degree of freedom than that of a permanent magnet in designing the shape thereof.

Figure 5A:
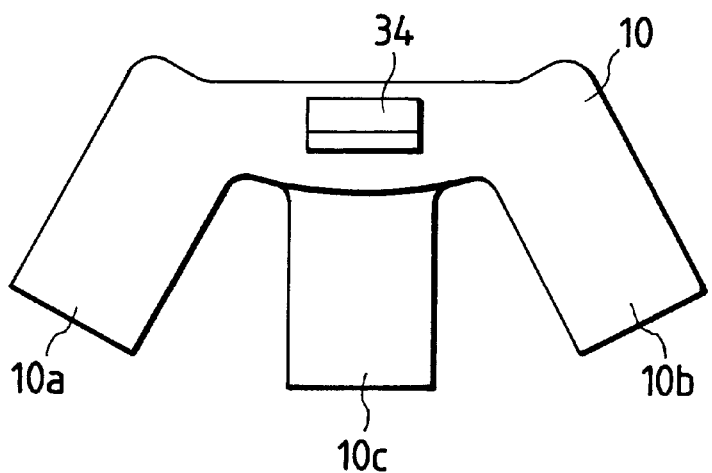
FIG. 5(a) is a front view which shows a magnet 10 of a switching apparatus.

The magnet 10 includes, as shown in FIG. 5(a), three-forked legs 10a to 10c which are oriented radially to have end surfaces thereof arranged on a curved plane so that the magnet 10 can swing at a constant gap away from the printed circuit board 12. The side legs 10a and 10b are magnetized to have S-poles. The central leg 10b is magnetized to have an N-pole. The side legs 10a and 10b are, as shown in FIG. 5(c), aligned with the swing motion of the magnet 10, while the central leg 10b is offset from a line extending between the side legs 10a and 10b.

The above arrangement of the three-forked legs 10a to 10c lengthens magnetic paths extending between the N-pole and the S-poles to increase the magnetic intensity, yet shortens intervals between the N-pole and the S-poles to strengthen the magnetic field, and orients magnetic lines of force radially from the N-pole toward the S-poles so that the magnetic lines of force spread over the MRE 36 symmetrically.

Figure 5B:
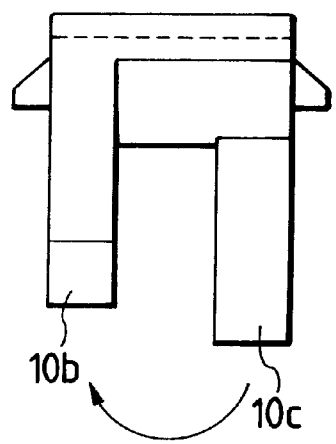
FIG. 5(b) is a side view of the magnet 10 shown in FIG. 5(a)
Figure 5B:
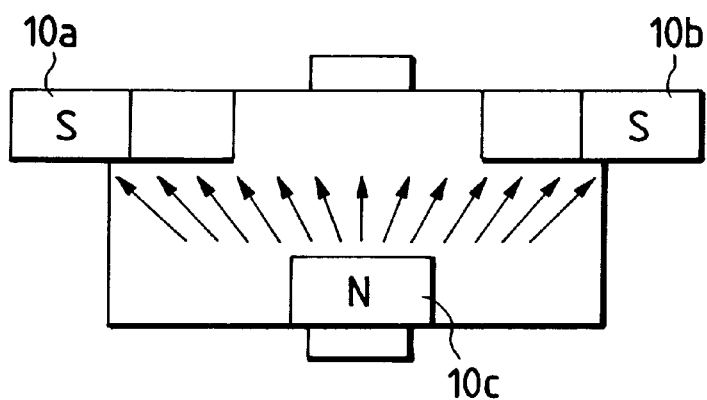
Figure 6:
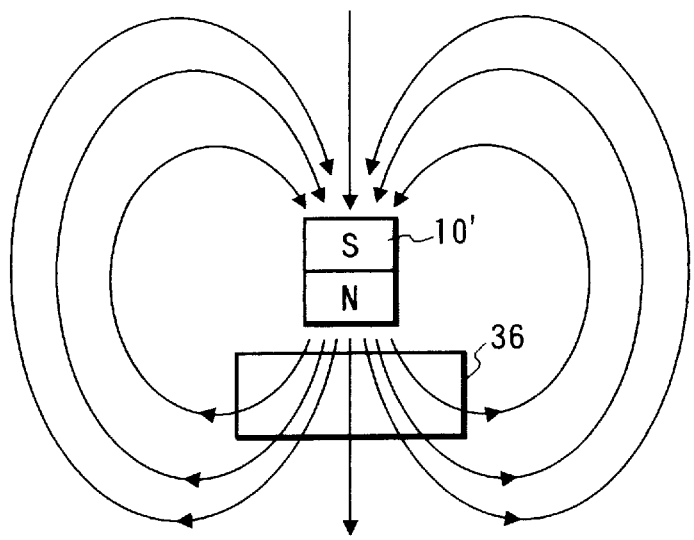
FIG. 6 is an illustration which shows a comparative example using a magnet 10'.

The magnetic bar 10', as shown in FIG. 6, may be used as the magnet 10. It is however necessary to exert a magnetic force of approximately 100 gausses or more on the MRE 36 at all times because of the Barkhausen noise and hysteresis of output characteristics of the MRE 36. This requires use of a large size of the magnetic bar 10', resulting in an increase in overall size of the switching apparatus. For these reasons, the magnet 10, as shown in FIGS. 5(a) to 5(c), is preferred to the magnetic bar 10'.

Figure 7A:
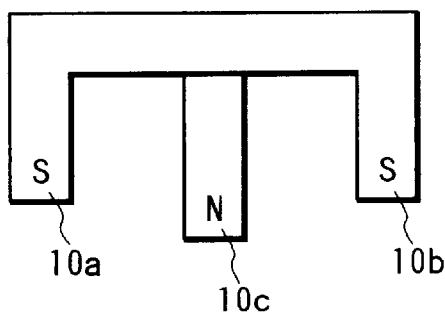
FIG. 7(a) is a front view which shows a modification of a magnet 10 of a switching apparatus.
Figure 7B:
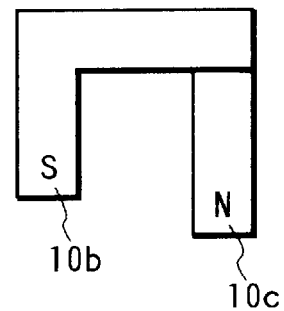
FIG. 7(b) is a side view of the magnet 10 shown in FIG. 7(a)
Figure 7C:
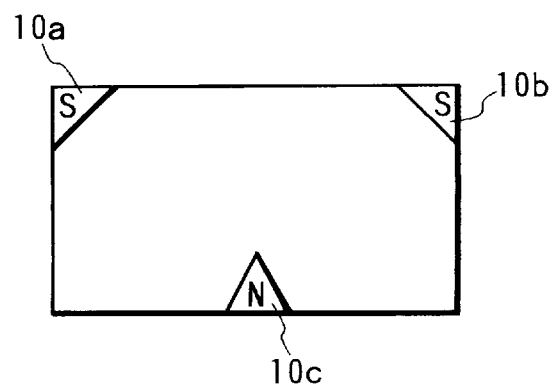
FIG. 7(c) is a bottom view of the magnet 10 shown in FIG. 7(a)
Figure 8A:
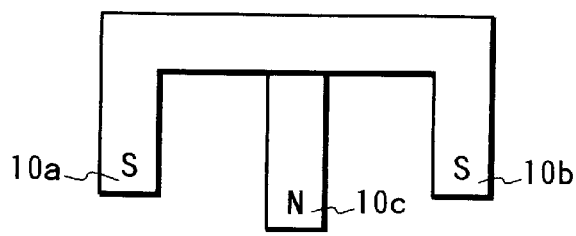
FIG. 8(a) is a front view which shows a second modification of a magnet 10 of a switching apparatus.
Figure 8B:
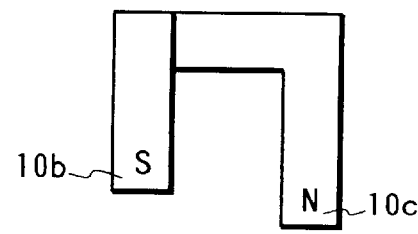
FIG. 8(b) is a side view of the magnet 10 shown in FIG. 8(a)
Figure 8C:
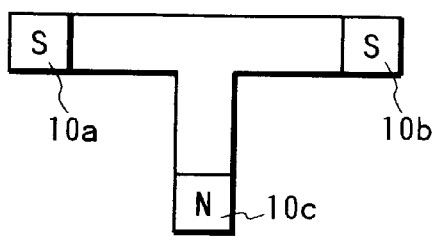
FIG. 8(c) is a bottom view of the magnet 10 shown in FIG. 8(a)
Figure 9A:
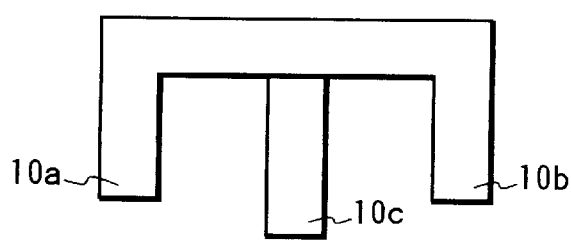
FIG. 9(a) is a front view which shows a third modification of a magnet 10 of a switching apparatus.
Figure 9B:
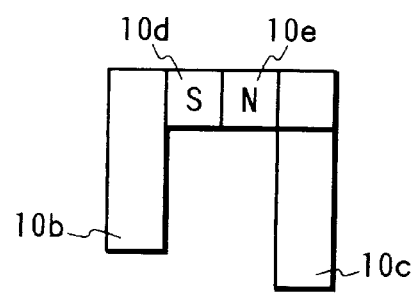
FIG. 9(b) is a side view of the magnet 10 shown in FIG. 9(a)
Figure 9C:
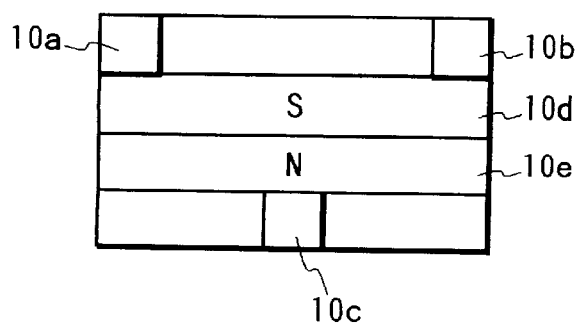
FIG. 9(c) is a bottom view of the magnet 10 shown in FIG. 9(a)

Specifically, the magnet 10 is not limited to the structure, as shown in FIGS. 5(a) to 5(b), however, it is required to produce the magnetic lines of force radially to exert the magnetic force of approximately 100 gausses or more on the MRE 36. For example, the magnet 10 may have a structure, as shown in FIGS. 7(a) to 7(c), which includes three legs 10a to 10b each having a triangular end surfaces as shown in FIG. 7(c) or a structure, as shown in FIGS. 8(a) to 8(c), which includes three legs 10a to 10b made of magnetic rectangular bars, or permanent magnets 10d and 10e and magnetic substances 10a to 10c, as shown in FIGS. 9(a) to 9(c).

The side legs 10a and 10b may alternatively be magnetized to have the N-poles, while the central leg 10c may be magnetized to have the S-pole.

Figure 10:
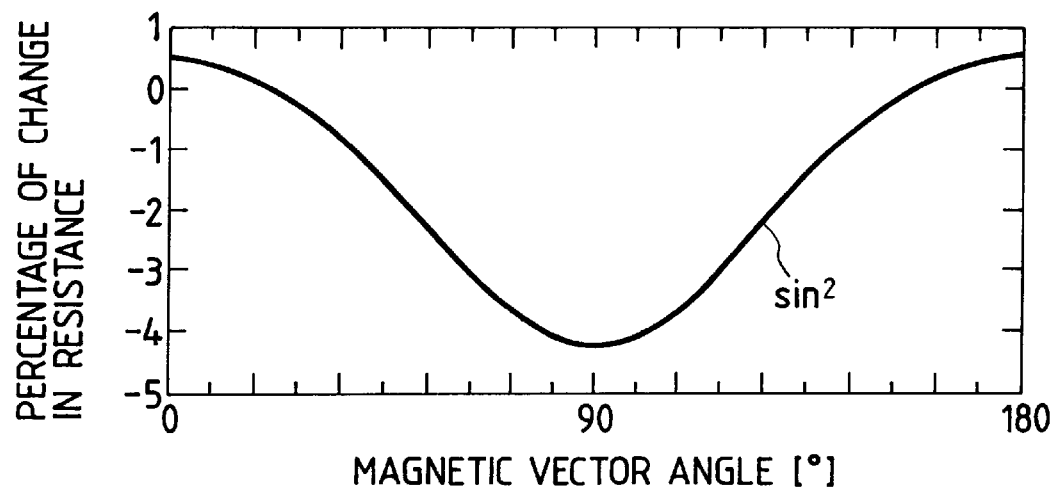
FIG. 10 is a graph which shows the relation between the percentage of change in resistance of a magnetoresistive element and the vector angle of a magnetic flux applied to the magnetoresistive element.

The MRE 36 is made of, for example, a silicon wafer over which NiCo is deposited and has a variable resistance, as shown in FIG. 10, changed according to a magnetic vector angle θ which the MRE 36 makes with the magnetic lines of force.

Figure 11:
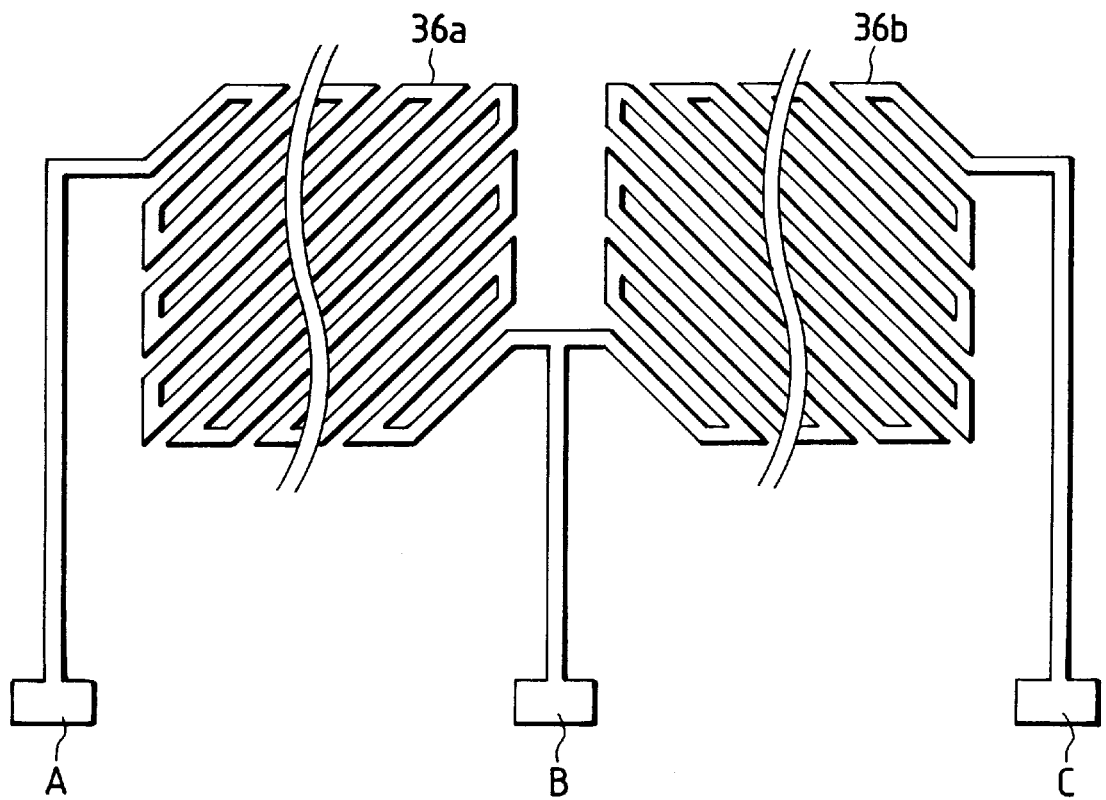
FIG. 11 is a plan view which shows a circuit structure of a magnetoresistive element.

Internally, the MRE 36 includes, as shown in FIG. 11, two branches or magnetoresistors 36a and 36b connected in series to make up a bridge circuit. The magnetoresistors 36a and 36b have symmetric wiring patterns wherein a conductive strip of the magnetoresistor 36a is oriented at a given angle to a conductive strip of the magnetoresistor 36b so that the same value of resistance appears between terminals A and B and between terminals B and C when no magnetic field is applied.

The detection of the operational positions of the manual operating knob 2 using the MRE 36 and the magnet 10 will be discussed below.

In the following discussion, it will be assumed that the switching apparatus of this embodiment is used as an operational switch for a power window control system for an automotive vehicle. The first, second, third, fourth, and fifth operational positions of the manual operating knob 2, as described above, will be referred to below as a stop position, a manual-up position, an automatic-up position, a manual-down position, and an automatic-down position, as shown in FIG. 12, respectively.

In the manual-down and manual-up positions, the window is opened and closed or moved downward and upward, respectively, only during an manual operation of the switching apparatus, while in the automatic-down and automatic-up positions, the window is fully opened and closed automatically once the switching apparatus is turned on.

The switching apparatus of this invention may have only three operational positions: the manual-up position, the stop position, and the manual-down position according to types of vehicle.

Figure 12:
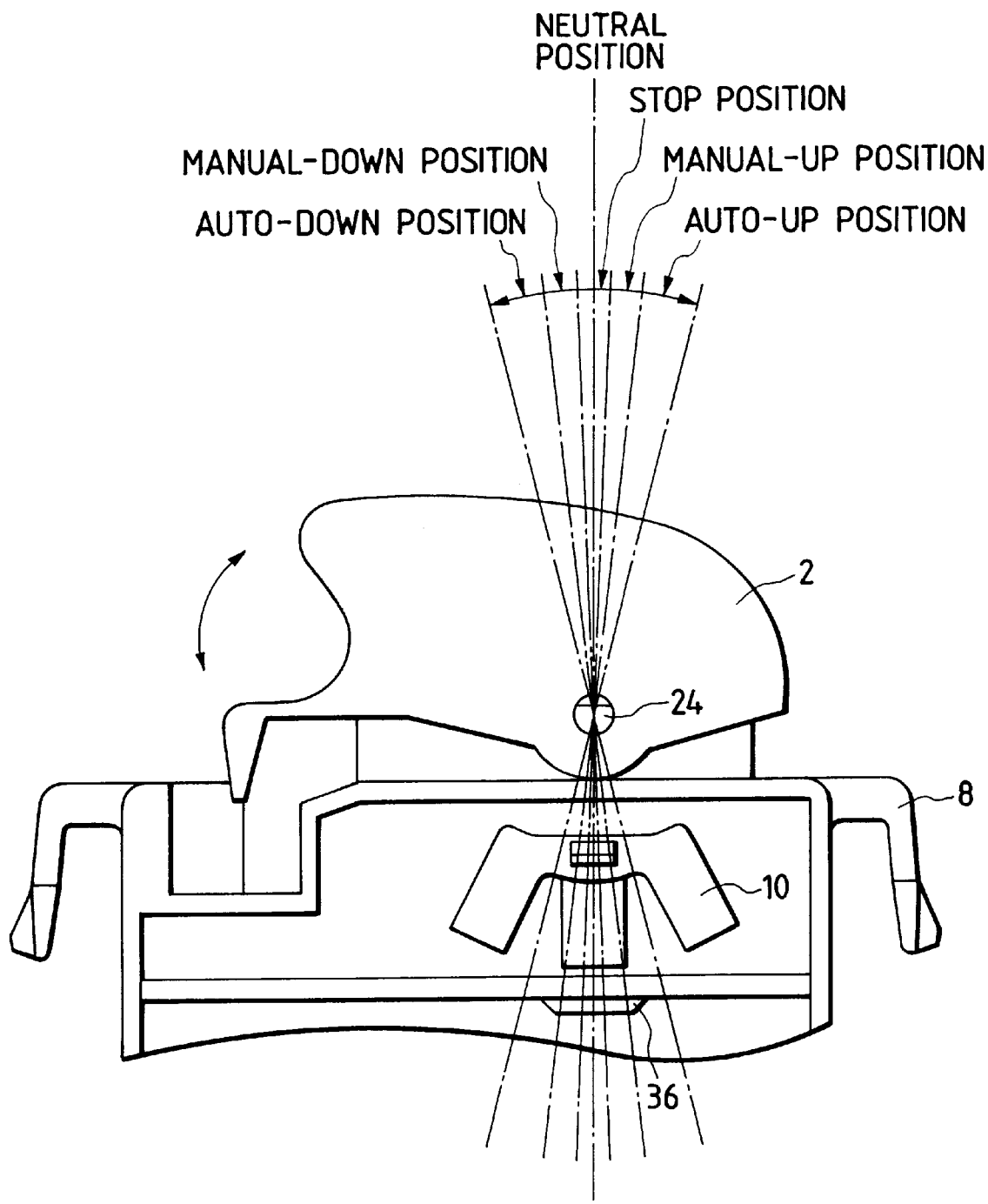
FIG. 12 is a cross sectional view which shows five operational positions of a switching apparatus selected according to movement of a manual operating knob 2.
Figure 13A:
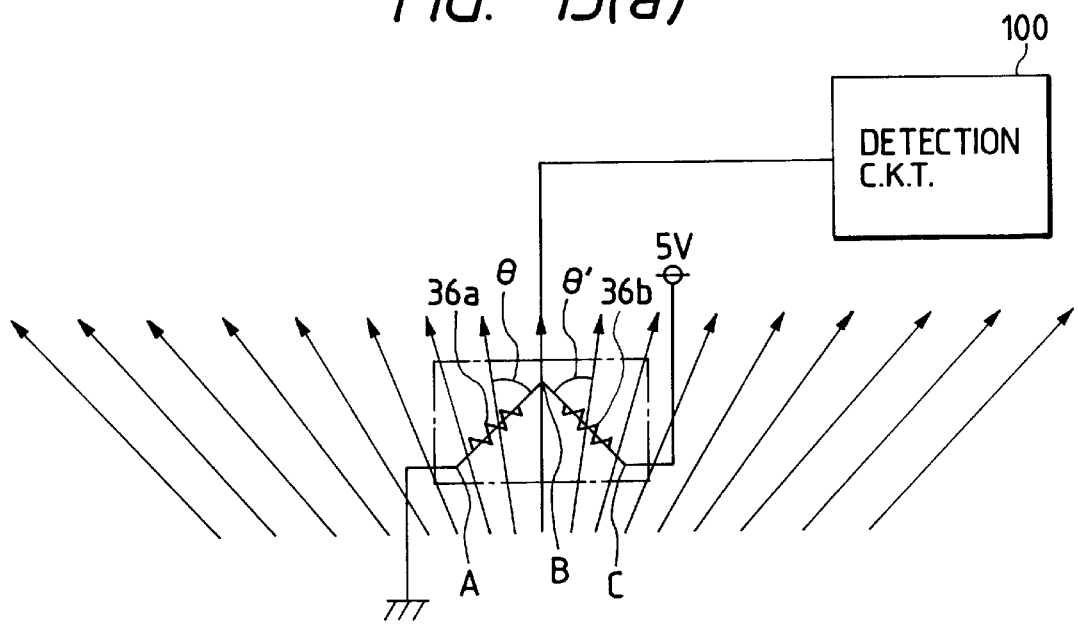
FIG. 13(a) shows a positional relation between a bridge circuit of a magnetoresistive element and a magnetic flux when a switching apparatus is in a neutral position.

When the manual operating knob 2 is in the neutral position as shown in FIG. 12, a magnetic flux produced by the magnet 10 bears the positional relation, as shown in FIG. 13(a), to the MRE 36. A constant voltage, for example, 5V is applied across the terminals A and C of the MRE 36. The angle θ which a line extending through the terminals A and B of the MRE 36 (hereinafter, referred to as an A-B line) makes with one of the magnetic lines of force is equal to the angle θ' which a line extending through the terminals B and C (hereinafter, referred to as a B-C line) makes with one of the magnetic lines of force (i.e., θ=θ') so that a change in resistance between the terminals A and B is identical with that between the terminals B and C. The resistances between the terminals A and B and between the terminals B and C are selected to be equal to each other when the magnetic field is not applied to the MRE 36 so that the electric potential appearing at the terminal B will be 2.5 V.

Figure 13B:
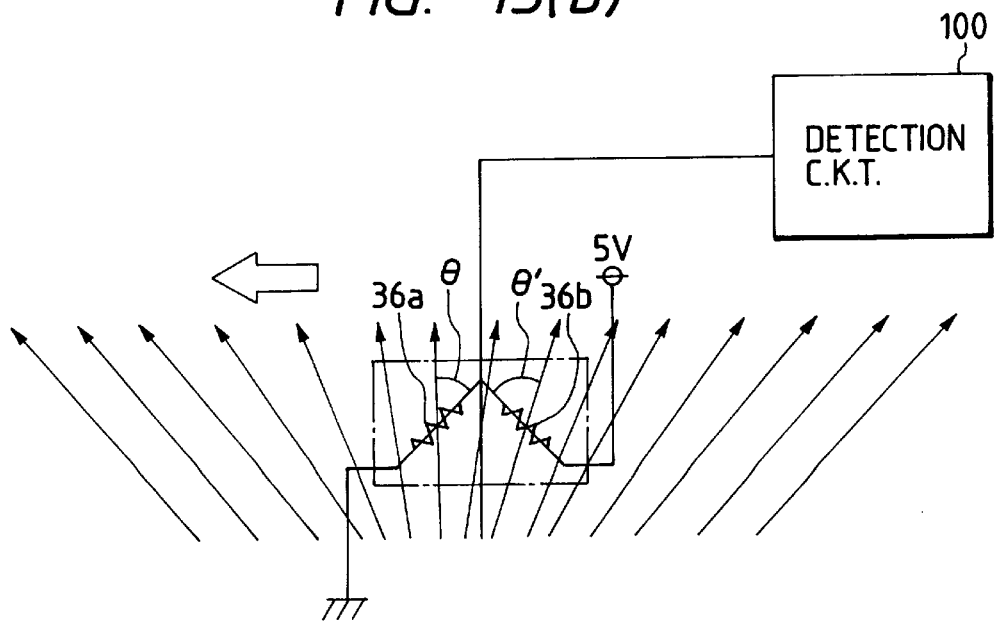
FIG. 13(b) shows a positional relation between a bridge circuit of a magnetoresistive element and a magnetic flux when a manual operating knob is shifted from a neutral position.

When the manual operating knob 2 is shifted to the manual-up position from the stop position, it will cause the magnet 10 to be moved in a direction, as indicated by a white arrow in FIG. 13(b), so that the orientation of the magnetic lines of force to the MRE 36 is changed as shown in the drawing. Specifically, the angle θ between the A-B line and one of the magnetic lines of force becomes smaller than that when the manual operating knob 2 is in the neutral position, that is, approaches 0° so that the resistance between the terminals A and B is increased. Conversely, the angle θ' between the B-C line and one of the magnetic lines of force becomes greater than that when the manual operating knob 2 is in the neutral position, that is, approaches 90° so that the resistance between the terminals B and C is decreased. Therefore, when the manual operating knob 2 is shifted to the manual-up position, it will cause the electric potential appearing at the terminal B of the MRE 36 rises from 2.5 V.

When the manual operating knob 2 is further moved from the manual-up position, the electric potential appearing at the terminal B of the MRE 36 rises further.

When the manual operating knob 2 is shifted to the manual-down and automatic-down positions, the positional relation between the magnetic flux and the MRE 36 will be the reverse of the above. Specifically, the electric potential appearing at the terminal B drops below 2.5 V.

Figure 14:
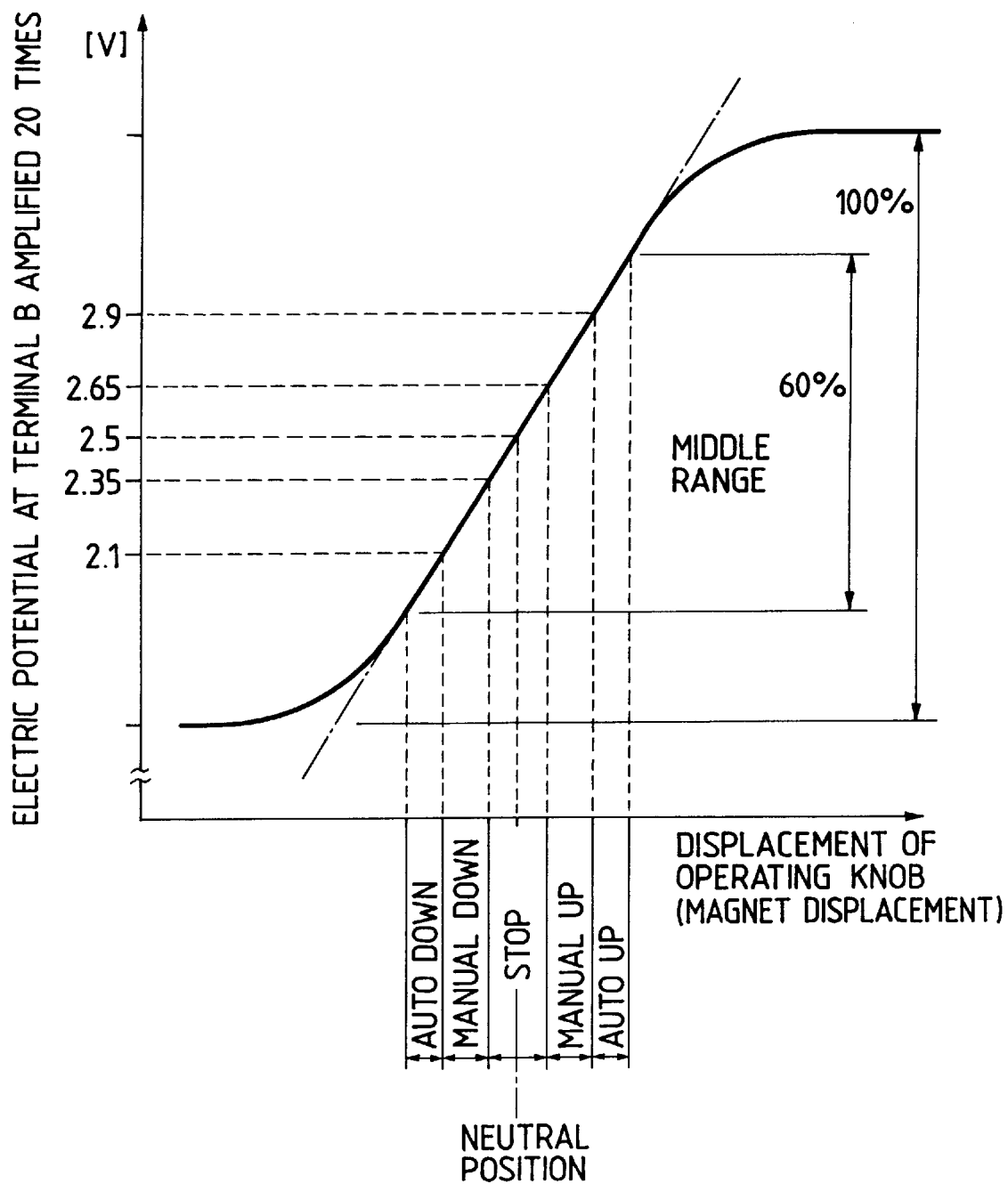
FIG. 14 is a graph which shows the relation between an electric potential appearing at a terminal B of a magnetoresistive element and a displacement of a magnet of a switching apparatus.

FIG. 14 shows the relation between the electric potential at the terminal B of the MRE 36 and the operational positions of the manual operating knob 2, which is approximate to a sin² curve. Note that the electric potential at the terminal B as indicated in the drawing show a value amplified 20 times.

A middle range corresponding to 60% of a total change in electric potential at the terminal B is, as can be seen in the drawing, substantially approximate to a straight line. Thus, accurate positional detection of the manual operating knob 2 is achieved by defining within this range the five operational positions of the manual operating knob 2: the stop, manual-up, automatic-up, manual-down, and automatic-down positions.

Figure 15A:
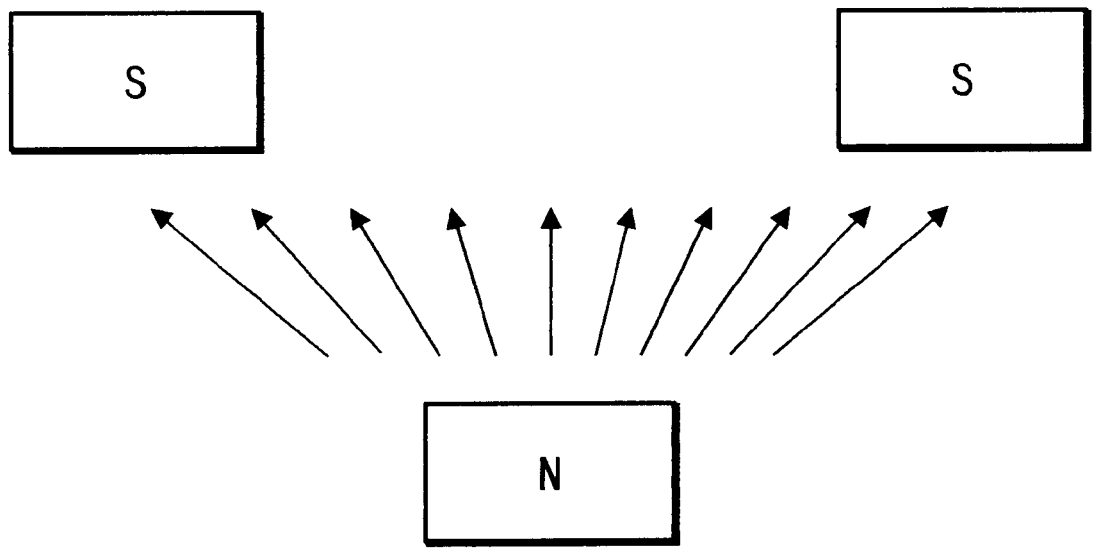
FIGS. 15(a) and 15(b) show positional relations between an N-pole and S-poles of a magnet used in a switching apparatus.
Figure 15B:
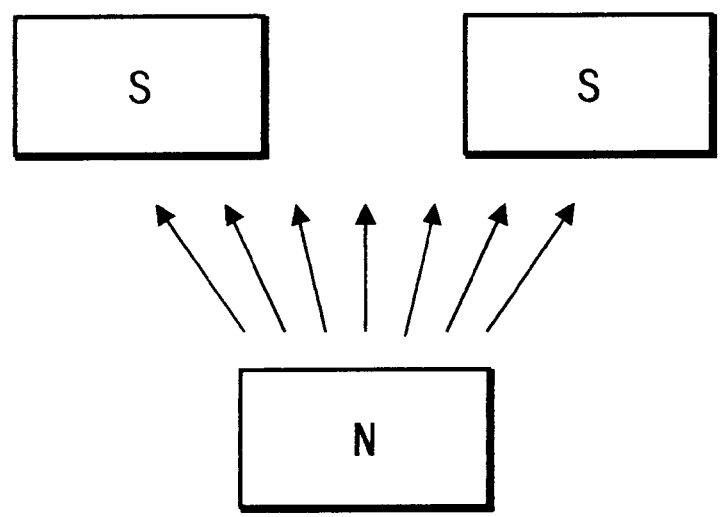

If an interval between the N-pole and each of the S-poles is wide as shown in FIG. 15(a), an inclination of a line within the middle range in FIG. 14 is decreased. Conversely, if the interval between the N-pole and each of the S-poles is narrow as shown in FIG. 15(b), the inclination of that line is increased. Thus, it is advisable that the five operational positions of the manual operating knob 2 be defined within the middle range in FIG. 14 by changing the interval between the N-pole and each of the S-poles to adjust the spread of the magnetic flux over the MRE 36.

In practice, when the electric potential $V_B'$ amplified by 20 times the electric potential appearing at the terminal B of the MRE 36 shows 2.9 V or more, it is determined that the manual operating knob 2 is in the automatic-up position. When 2.9 V>$V_B'$≧2.65 V, it is determined that the manual operating knob 2 is in the manual-up position. When 2.65 V>$V_B'$>2.35 V, it is determined that the manual operating knob 2 is in the stop position. When 2.35 V≧$V_B'$>2.1 V, it is determined that the manual operating knob 2 is in the manual-down position. When 2.1 V≧$V_B'$, it is determined that the manual operating knob 2 is in the automatic-down position. It is advisable that determination of these threshold values of the electric potentials take into consideration the operationability of the switching apparatus.

Figure 16:
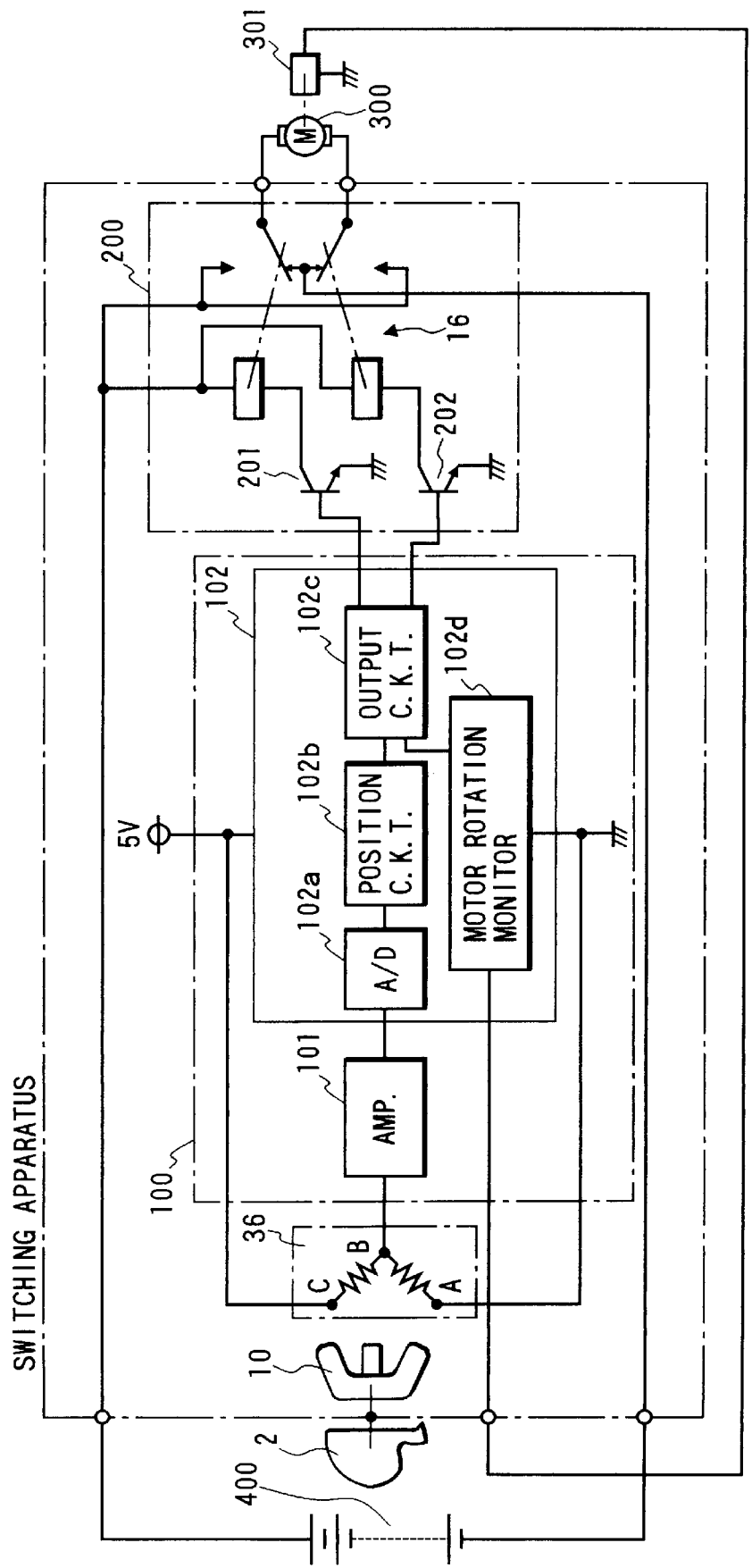
FIG. 16 is a circuit diagram which shows an electric structure of a power window control system using a switching apparatus of the invention.

FIG. 16 shows a circuit structure of a power window control system using the switching apparatus of this embodiment.

An electric potential signal indicating the electric potential appearing at the terminal B of the MRE 36 is inputted to the detection circuit 100. The detection circuit 100 includes an amplifier 101 and a microcomputer 102. The microcomputer 102 includes an A/D converter 102a, an operational position determining circuit 102b, a motor control circuit 102c, and a motor rotation monitor 102d. The amplifier 101 amplifies the input electric potential signal and provides it to the A/D converter 102a of the microcomputer 102. The A/D converter 102 converts the amplified electric potential signal into a digital signal and provides it to the operational position determining circuit 102b. The operational position determining circuit 102b compares with the input signal with preselected threshold values to determine the operational position of the manual operating knob 2. The motor control circuit 102c outputs a motor control signal according to the operational position determined by the operational position determining circuit 102b.

The power window control system also includes the motor driver 200 and a motor rotation sensor 301. The motor driver 200 includes two transistors 210 and 202 and a relay 16 and controls the power supply from a storage battery 400 to the power window motor 300. The motor rotation sensor 301 measures the number of rotations of the power window motor 300 after being turned on and provides a signal indicative thereof to the motor rotation monitor 102d. The motor rotation monitor 102d is responsive to the signal from the motor rotation sensor 301 to determine the position of the window and brings the window to a stop when the window has reached a given position.

Usually, the magnet 10 and the MRE 36 have inevitable unit-to-unit variations arising on fabrication and installation in the switching apparatus, which will cause an error in determining the position of the manual operating knob 2 through the microcomputer 102. For example, the unit-to-unit variations of the magnet 10 and the MRE 36 involve a difference between resistances between the terminals A and B and between the terminals B and C of the MRE 36, a variation in size of the magnet 10, a variation in orientation of the MRE 36 relative to the printed circuit board 12, and a variation in positional relation between the magnet 10 and the MRE 36 when the manual operating knob 2 is in the neutral position. These types of variation cause a solid line, as shown in FIG. 17, indicating a variation in electric potential appearing at the terminal B of the MRE 36 within the middle range in FIG. 14 to be shifted in parallel in a vertical direction, as illustrated by a broken line, and/or to change in inclination thereof as illustrated by an alternate long and short dash line.

The output characteristics of the MRE 36 however become stable or is fixed after being installed in the switching apparatus and never change due to the above variations. The effects of the above variations may therefore be eliminated by carrying out given adjustment, as will be discussed later in detail, after assembly of the switching apparatus.

Figure 17:
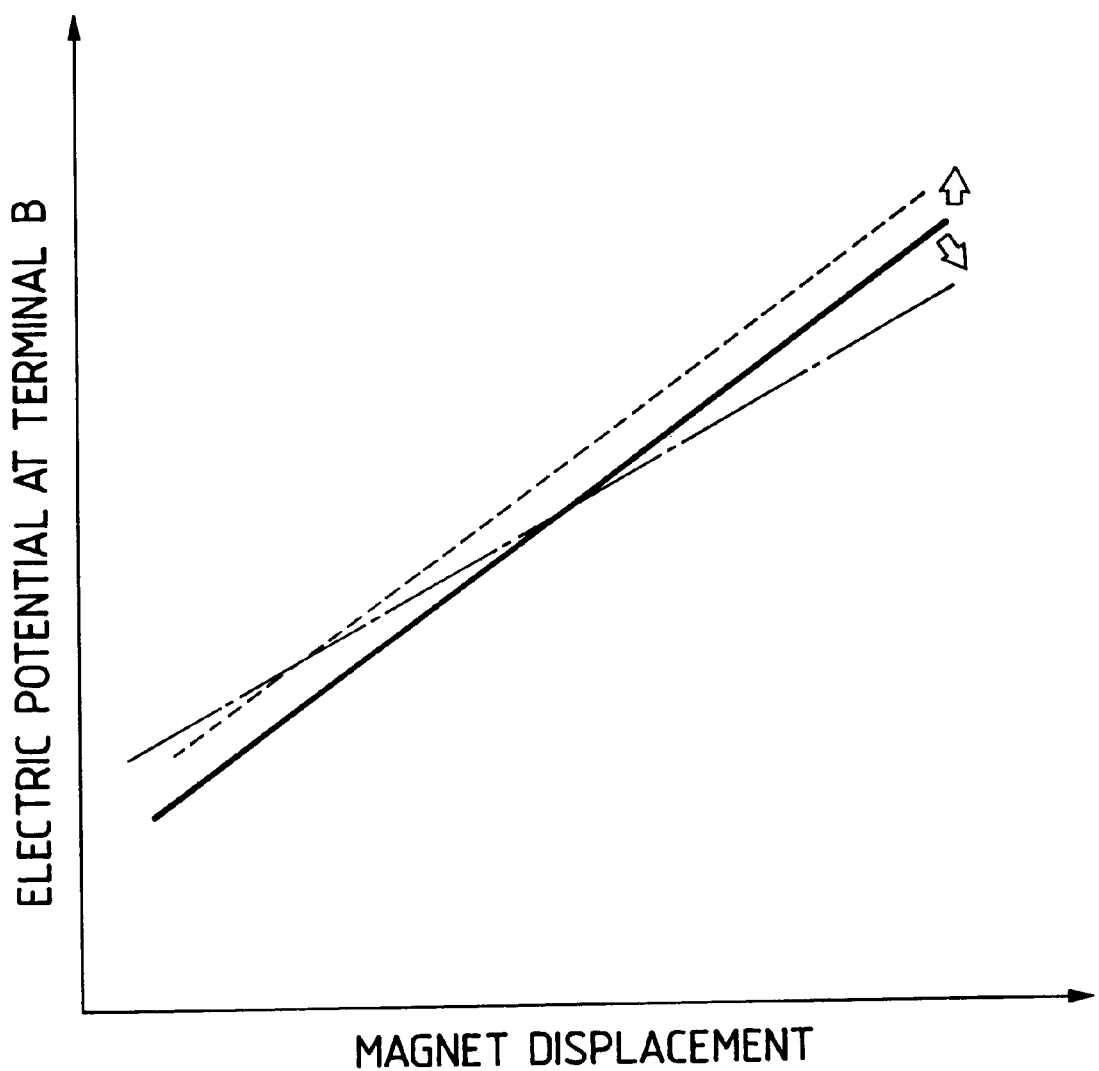
FIG. 17 is a graph which shows a variation in output characteristic of a magnetoresistive element caused by unit-to-unit variations in magnet and magnetoresistive element.
Figure 18:
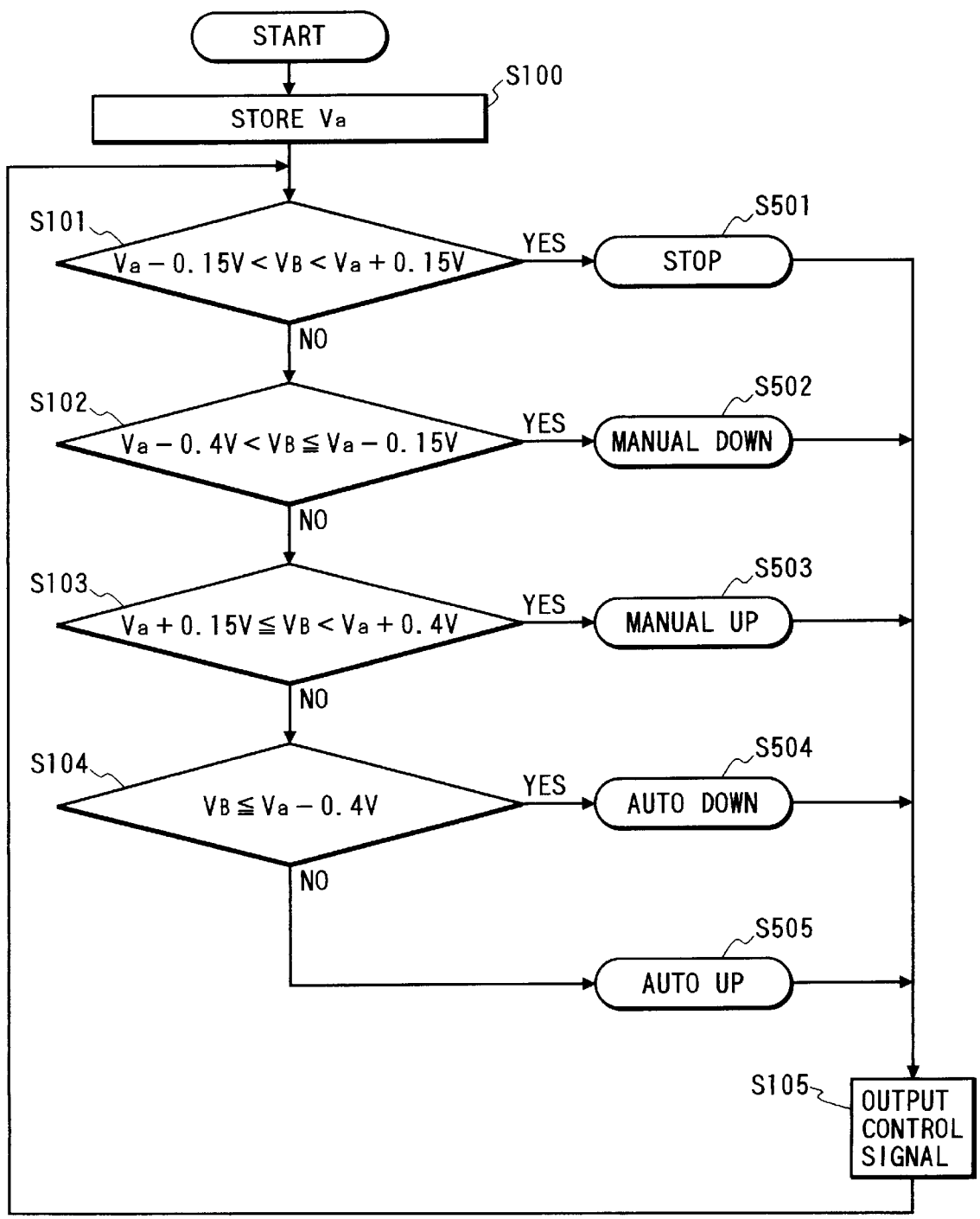
FIGS. 18 and 19 are flowcharts of programs performed by a power window control system.

FIG. 18 shows a flowchart of a program performed by the microcomputer 102 to determine the position of the manual operating knob 2 if the potential line (i.e., the output characteristics of the MRE 36), as shown in FIG. 17, is shifted only in the vertical direction without changing the inclination thereof.

After entering the program, the routine proceeds to step 100 wherein given initialization is performed, and an electric potential appearing at the terminal B of the MRE 36 when the manual operating knob 2 is in the neutral position is monitored and stored as an electric potential $V_a$ in a memory of the microcomputer 102. This step is executed only one time immediately after the switching apparatus is installed in the vehicle and connected to the battery 400 to activate the microcomputer 102. This is because there is almost no possibility of the manual operation knob 2 being moved by a vehicle operator immediately after installation of the switching apparatus in the vehicle.

The routine then proceeds to step 101 wherein threshold values for determining the stop position are calculated by adding and subtracting 0.15 V to and from the electric potential $V_a$, and compared with the electric potential $V_B$ which is now appearing at the terminal B of the MRE 36. If $V_a$−0.15 V<$V_B$<$V_a$+0.15 V, then the routine proceeds to step 501 wherein it is determined that the manual operating knob 2 is in the stop position.

Alternatively, if the determination in step 101 is negative, then the routine proceeds to step 102 wherein it is determined whether the relation of $V_a$−0.4 V<$V_B$≦$V_a$−0.15 V is met or not. If a YES answer is obtained, then the routine proceeds to step 502 wherein it is determined that the manual operating knob 2 is in the manual-down position.

If a NO answer is obtained in step 102, then the routine proceeds to step 103 wherein it is determined whether the relation of $V_a$+0.15 V≦$V_B$<$V_a$+0.4 V is met or not. If a YES answer is obtained, then the routine proceeds to step 503 wherein it is determined that the manual operating knob 2 is in the manual-up position.

If a NO answer is obtained in step 103, then the routine proceeds to step 104 wherein it is determined whether the relation of $V_B \leq V_a - 0.4$ V is met or not. If a YES answer is obtained, then the routine proceeds to step 504 wherein it is determined that the manual operating knob 2 is in the automatic-down position.

Alternatively, if a NO answer is obtained in step 104, then the routine proceeds to step 505 wherein it is determined that the manual operating knob 2 is in the automatic-up position.

After step 501, 502, 503, 504, or 505, the routine proceeds to step 105 wherein a motor control signal is outputted according to the determination in step 501, 502, 503, 504, or 505.

In this example, the threshold values are, as apparent from the above discussion, determined based on the electric potential $V_a$ measured when the manual operating knob 2 is in the neutral position, thus achieving an accurate determination of the position of the manual operating knob 2 even if the output characteristics of the MRE 36 are, as shown in FIG. 17, changed from the solid line to the broken line.

Figure 19:
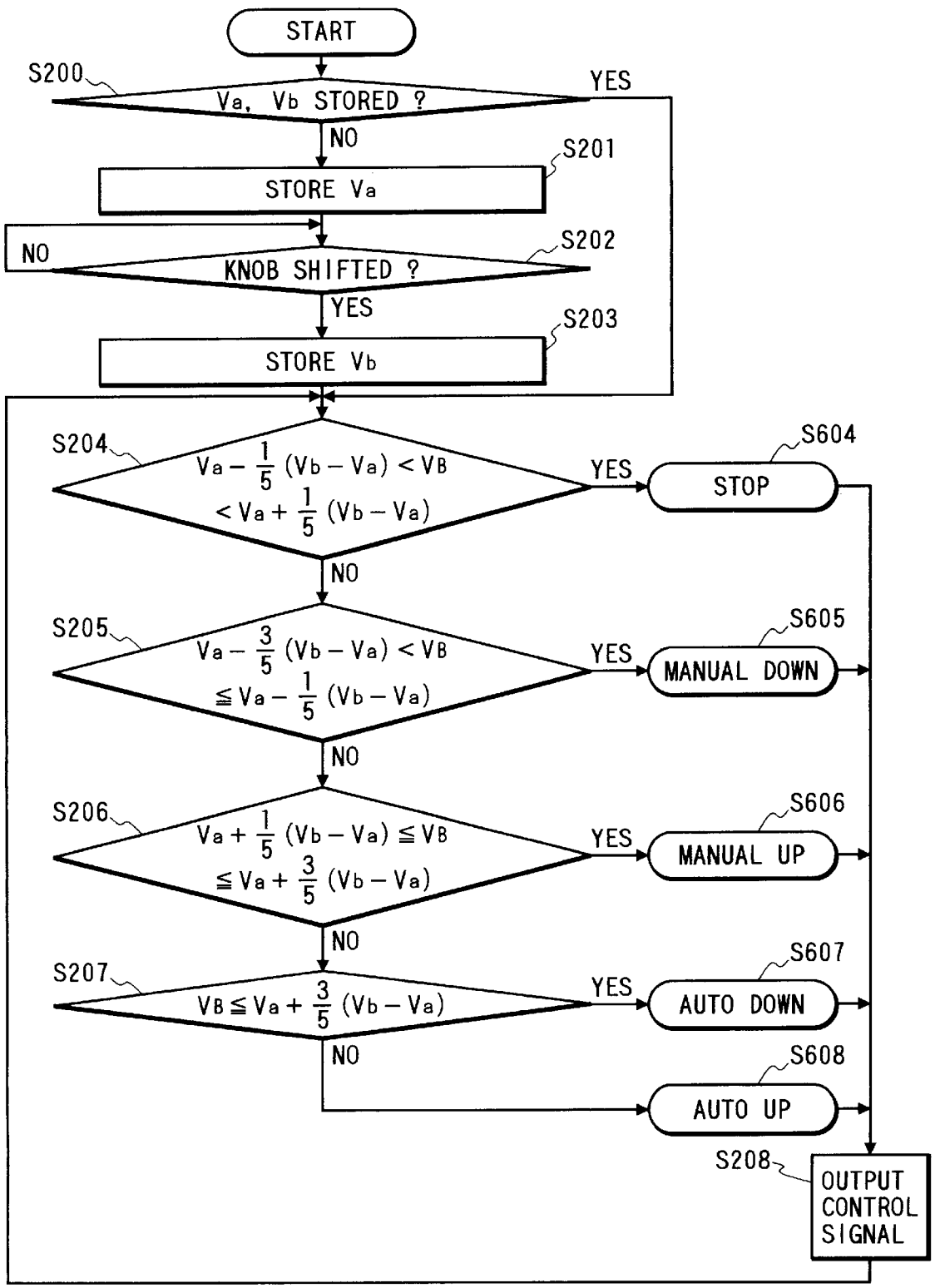

If the compensation for the variations in output characteristic of the MRE 36 causing the potential line as shown in FIG. 17 to be both shifted in the vertical direction and changed in inclination, is required, the microcomputer 102 may operate according to a flowchart as shown in FIG. 19.

Steps 200 to 203, as discussed below, are executed in a manufacturing process after assembly of the switching apparatus.

First, in step 200, it is determined whether the electric potential $V_a$ appearing at the terminal B of the MRE 36 when the manual operating knob 2 is in the neutral position and the electric potential $V_b$, as will be described later, are stored in the microcomputer 102 or not. If a YES answer is obtained, then the routine proceeds directly to step 204. Alternatively if a NO answer is obtained, then the routine proceeds to step 201 wherein the electric potential $V_a$ measured and stored in a nonvolatile memory of the microcomputer 102 such as a memory using fuses or a semiconductor memory.

The routine then proceeds to step 202 wherein the manual operating knob 2 is shifted fully to a limit, for example, the automatic-up position, and then it is determined whether a preselected period of time following the storage of the electric potential $V_a$ has expired or the shifting of the manual operating knob 2 to the automatic-up position has been completed or not. If a NO answer is obtained, then the routine repeats step 202. Alternatively, if a YES answer is obtained, then the routine proceeds to step 203 wherein an electric potential $V_b$ appearing at the terminal B of the MRE 36 is measured and stored in the nonvolatile memory of the microcomputer 102.

The following steps are initiated after installation of the switching apparatus in the vehicle.

First, in step 204, it is determined whether the relation of $V_a - \frac{1}{5}(V_b - V_a) < V_B < V_a + \frac{1}{5}(V_b - V_a)$ is met or not. If a YES answer is obtained, then the routine proceeds to step 604 wherein it is determined that the manual operating knob 2 is in the stop position.

Alternatively, if a NO answer is obtained in step 204, then the routine proceeds to step 205 wherein it is determined whether the relation of $V_a - \frac{3}{5}(V_b - V_a) < V_B \leq V_a - \frac{1}{5}(V_b - V_a)$ is met or not. If a YES answer is obtained, then the routine proceeds to step 605 wherein it is determined that the manual operating knob 2 is in the manual-down position.

If a NO answer is obtained in step 205, then the routine proceeds to step 206 wherein it is determined whether the relation of $V_a + \frac{1}{5}(V_b - V_a) \leq V_B \leq V_a + \frac{3}{5}(V_b - V_a)$ is met or not. If a YES answer is obtained, then the routine proceeds to step 606 wherein it is determined that the manual operating knob 2 is in the manual-up position.

If a NO answer is obtained in step 206, then the routine proceeds to step 207 wherein it is determined whether the relation of $V_B \leq V_a + \frac{3}{5}(V_b - V_a)$ is met or not. If a YES answer is obtained, then the routine proceeds to step 607 wherein it is determined that the manual operating knob 2 is in the automatic-down position.

Alternatively, if a NO answer is obtained in step 207, then the routine proceeds to step 608 wherein it is determined that the manual operating knob 2 is in the automatic-up position.

After step 604, 605, 606, 607, or 608, the routine proceeds to step 208 wherein a motor control signal is outputted according to the determination in step 604, 605, 606, 607, or 608.

In this example, the threshold values for determining the position of the manual operating knob 2 are, as apparent from the above, determined using $V_a$ and the difference $(V_b - V_a)$. Specifically, the use of $V_a$ compensates for the vertical change in potential line of the MRE 36, as shown in FIG. 17, while the use of the difference $(V_b - V_a)$ compensates for the change in inclination of the potential line.

Figure 20:
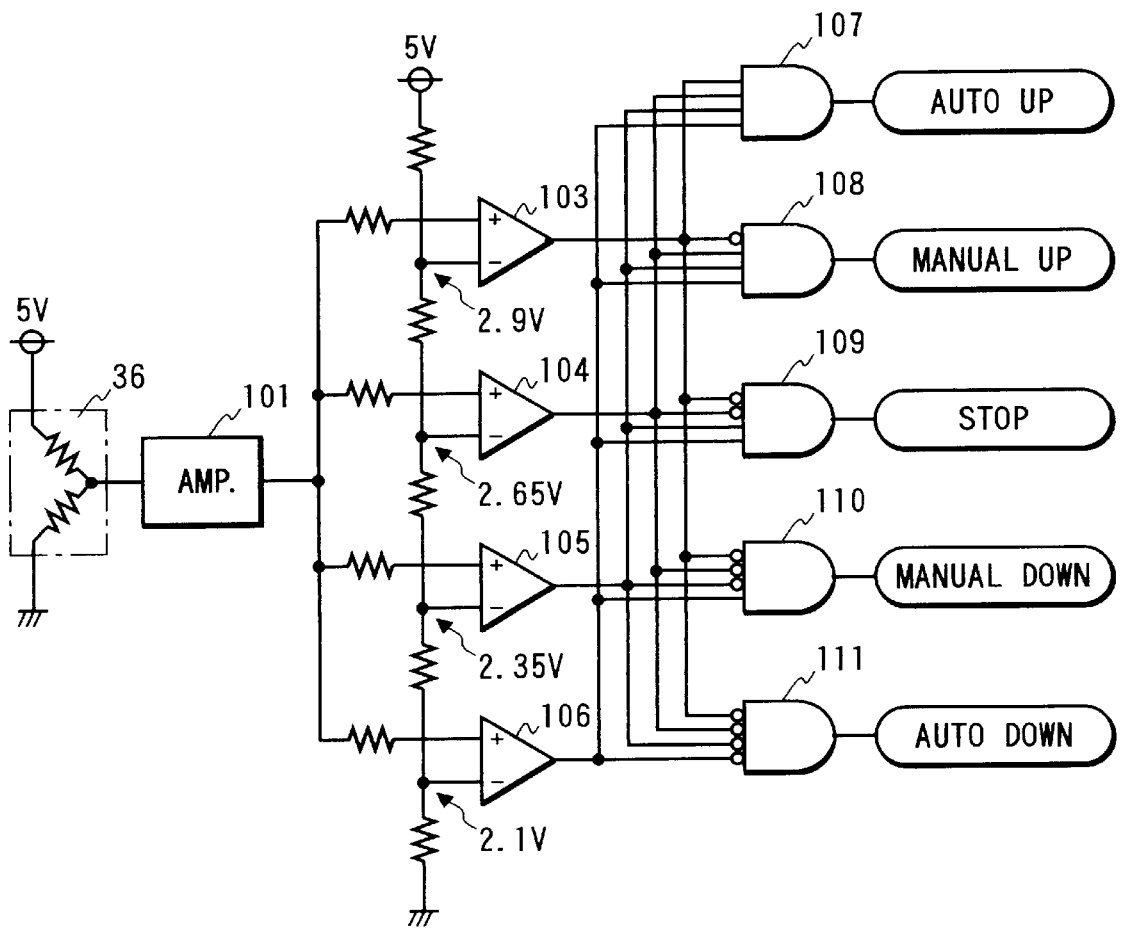
FIG. 20 shows a circuit diagram which shows an electric structure of a switching apparatus according to the second embodiment.

The microcomputer 102 may be replaced with a circuit, as shown in FIG. 20, which includes four comparators 103 to 106 and logical elements 107 to 111. Each of the comparators 103 to 106 compares the electric potential $V_b$ appearing at the terminal B of the MRE 36 inputted from the amplifier 101 with one of threshold values and provides an output to the logical elements 107 to 111. Each of the logical elements 107 to 111 performs a logical operation on the outputs from the comparators 103 to 106 to determine the position of the manual operating knob 2.

Figure 21:
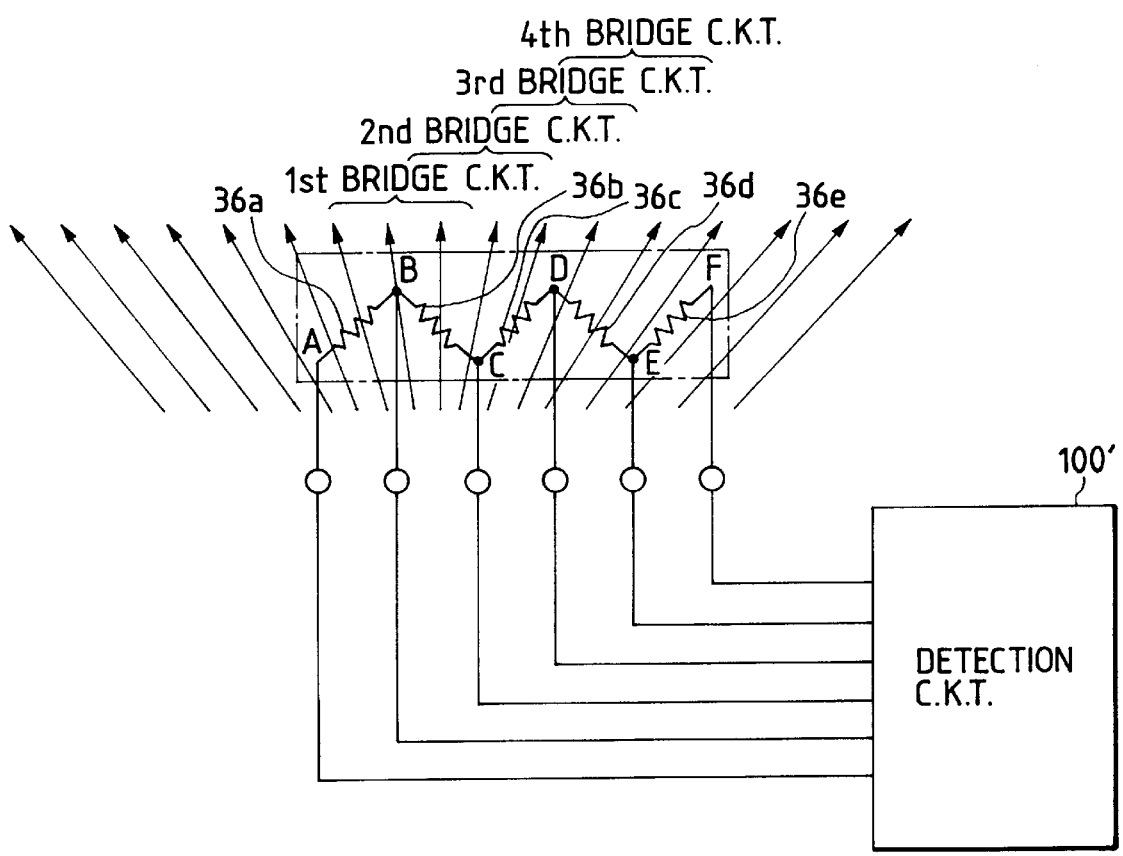
FIG. 21 shows a modification of a magnetoresistive element.

FIG. 21 shows a modification of the MRE 36 which includes a plurality of bridge circuits.

The MRE 36 has five branches or magnetoresistors 36a to 36e which make up four bridge circuits. Specifically, the first bridge circuit consists of magnetoresistors 36a and 36b. The second bridge circuit includes the magnetoresistors 36b and 36c. The third bridge circuit includes the magnetoresistors 36c and 36d. The fourth bridge circuit includes the magnetoresistors 36d and 36e.

In the drawing, B, C, D, and E indicate central points (i.e., terminals) of the first, second, third, and fourth bridge circuits, respectively.

Figure 22:
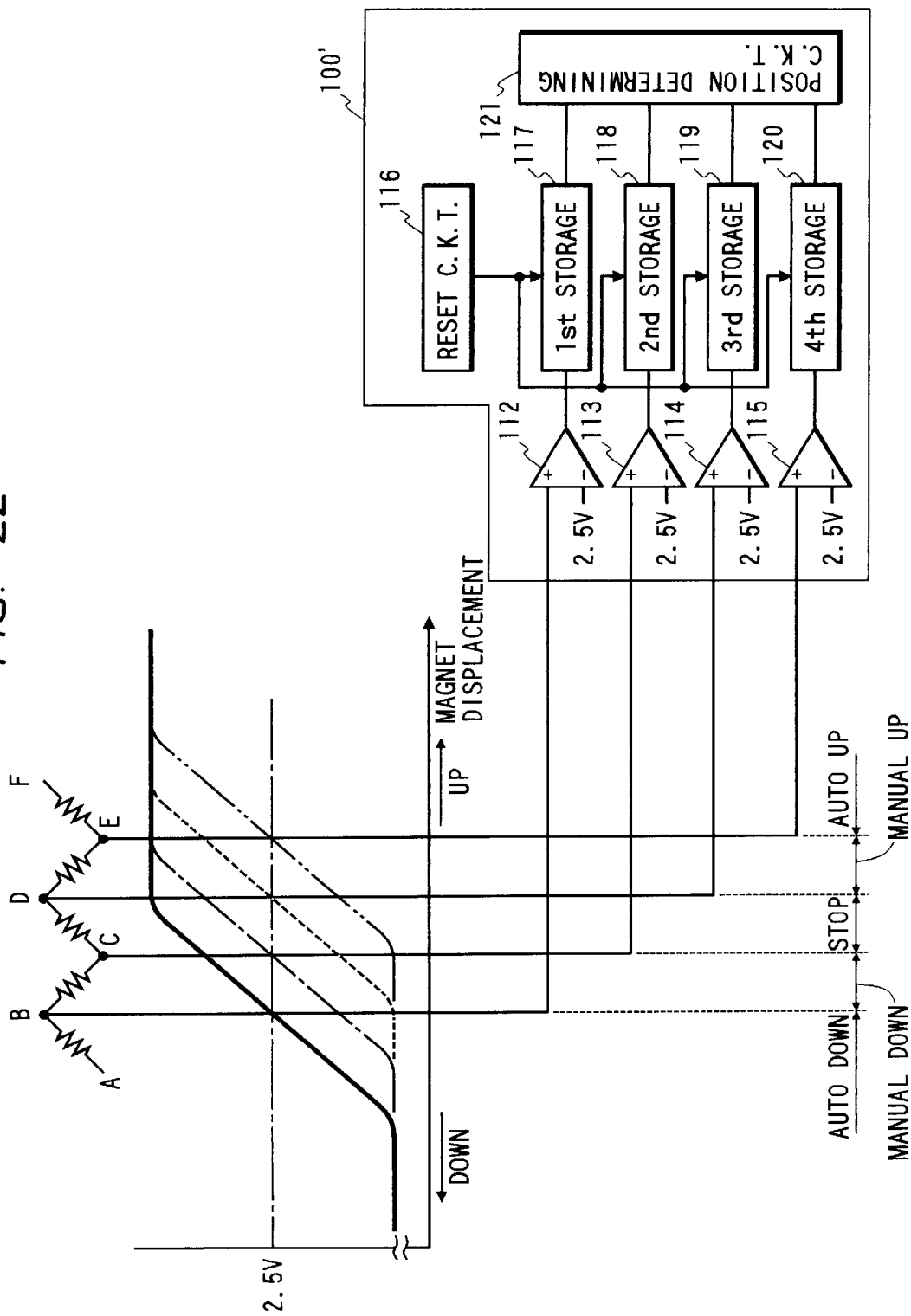
FIG. 22 shows a circuit structure of a detection circuit used in the modification in FIG. 21.

Specifically, the MRE 36 of this embodiment has arranged in series a plurality of circuits each similar to the one shown in FIG. 11. The electric potentials appearing at the terminals B, C, D, and E of the first to fourth bridge circuits are changed, as shown by solid and broken lines in FIG. 22, by variations in resistance of the first to fourth bridge circuits according to the movement of the manual operating knob 2. The detection circuit 100' of this embodiment thus determines the position of the manual operating knob 2 based on the level of the electric potential appearing at each of the terminals B to E of the first to fourth bridge circuits.

The detection circuit 100' includes first to fourth comparators 112 to 115, a reset circuit 116, first to fourth storage circuit 117 to 120, and an operational position determining circuit 121. The detection circuit 100' determines the electric potentials appearing at the terminals B, C, D, and E of the first to fourth bridge circuits, in sequence, as discussed below.

Figure 23:
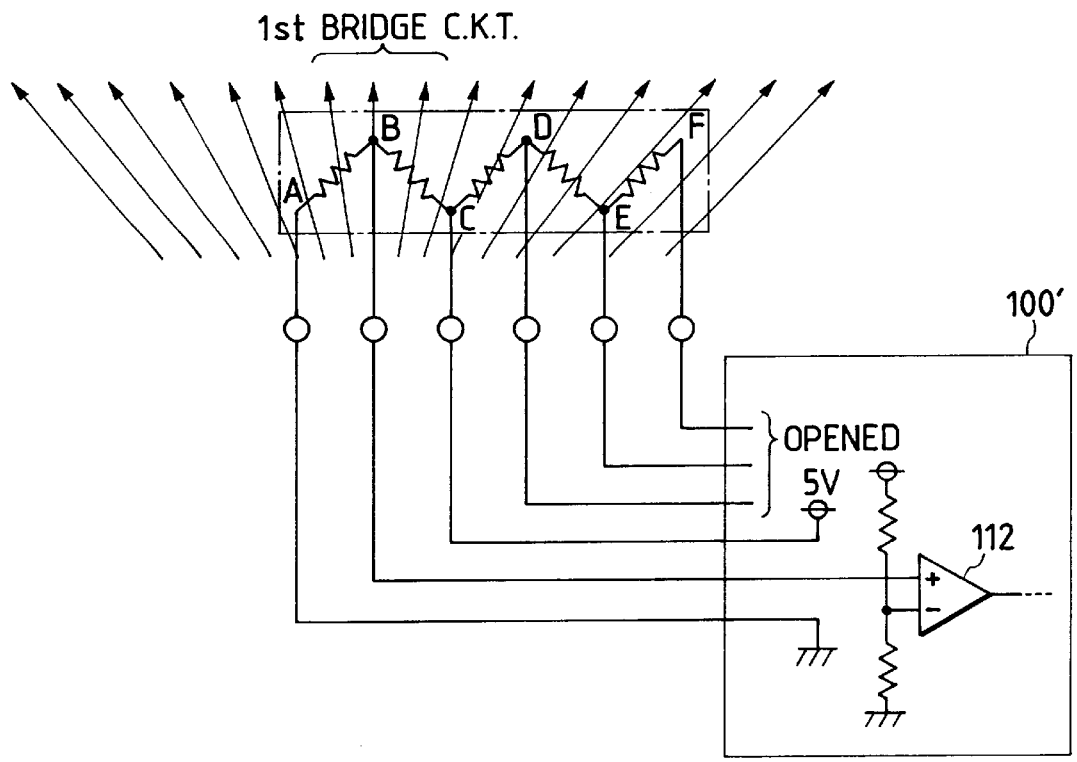
FIG. 23 shows the relation of connections between a magnetoresistive element and a first comparator 112 when an electric potential appearing at a first bridge circuit is measured.

First, the electric potential at the terminal B of the first bridge circuit is determined in the following manner. 5V is, as shown in FIG. 23, applied to the terminal C. The terminals A and B are connected to ground and the first comparator 112, respectively. The other terminals D to F are opened. The movement of the magnet 10 causes the electric potential at the terminal B of the first bridge circuit to be changed according to an output characteristic as indicated by the solid line in FIG. 22. The first comparator 112 compares the electric potential at the terminal B with a reference voltage of 2.5 V and provides a logic signal (i.e., high-level or low-level signal) indicative thereof to the first storage circuit 117. When the application of magnetic flux to the magnetoresistors 36a and 36b of the first bridge circuit is uniform, the electric potential at the terminal B to shows 2.5 V.

Figure 24:
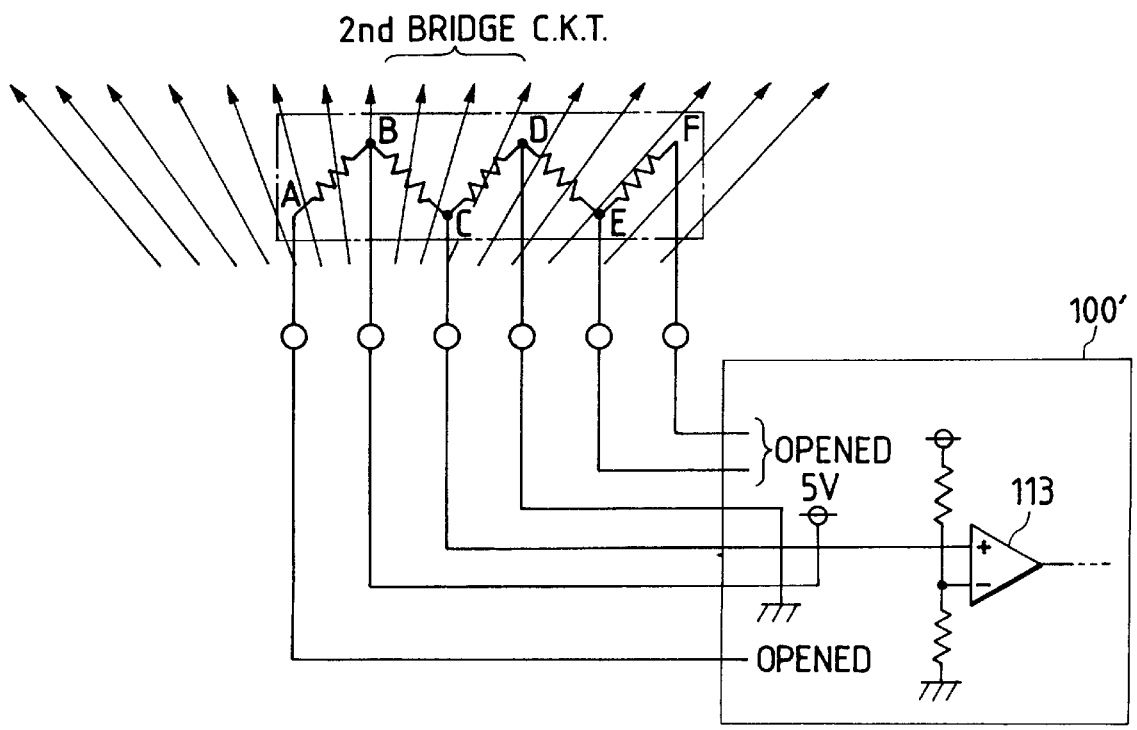
FIG. 24 shows the relation of connections between a magnetoresistive element and a second comparator 113 when an electric potential appearing at a second bridge circuit is measured.

Next, the electric potential at the terminal C of the second bridge circuit is determined. 5 V is, as shown in FIG. 24, applied to the terminal B. The terminals D and C are connected to ground and the second comparator 113, respectively. The other terminals A, E, and F are opened. The movement of the magnet 10 causes the electric potential at the terminal C of the second bridge circuit to be changed according to an output characteristic as indicated by the alternate long and short dash line in FIG. 22. The second comparator 113 compares the electric potential at the terminal C with a reference voltage of 2.5 V and provides a logic signal indicative thereof to the second storage circuit 118.

Thirdly, the electric potential at the terminal D of the third bridge circuit is determined. 5 V is applied to the terminal E. The terminals C and D are connected to ground and the third comparator 114, respectively. The other terminals A, B, and F are opened. The electric potential at the terminal D of the third bridge circuit is changed by movement of the magnet 10 along an output characteristic as indicated by the short dashes line in FIG. 22. The third comparator 114 compares the electric potential at the terminal D with a reference voltage of 2.5 V and provides a logic signal indicative thereof to the third storage circuit 119.

Finally, the electric potential at the terminal E of the fourth bridge circuit is determined. 5 V is applied to the terminal D. The terminals F and E are connected to ground and the fourth comparator 115, respectively. The other terminals A, B, and C are opened. The electric potential at the terminal E of the fourth bridge circuit is changed by movement of the magnet 10 along an output characteristic as indicated by the alternate long and two short dashes line in FIG. 22. The fourth comparator 115 compares the electric potential at the terminal E with a reference voltage of 2.5 V and provides a logic signal indicative thereof to the fourth storage circuit 120.

After the electric potential at the terminal E of the fourth bridge circuit is determined and stored in the fourth storage circuit 120, the above sequence of operations are repeated in cycles much shorter than a switching operation of the manual operating knob 2 (e.g., 10 ms or less). The first to fourth storage circuit 117 to 120 are reset by the reset circuit 116 each time the sequence of operations of the first to fourth comparators 112 to 115 are completed.

Specifically, the detection circuit 100' switches the connections of the terminals A to F of the first to fourth bridge circuits of the MRE 36, in sequence, between combinations as shown in the table 1 of FIG. 25. The first to fourth comparators 112 to 115 may be replaced with a single comparator.

When the electric potentials at the terminals B to E are all stored in the first to fourth storage circuits 117 to 120, the operational position determining circuit 121 determines the position of the manual operating knob 2 according to combinations of levels of the logic signals, as shown in the table 2 of FIG. 26, stored in the first to fourth storage circuits 117 to 120.

The four bridge circuits made up of the five magnetoresistors 36a to 36e may be separate from each other. In this case, it is possible to determine the electric potentials at central points of the bridge circuits at the same time without need for the above described sequential detections of the electric potentials.

Figure 27:
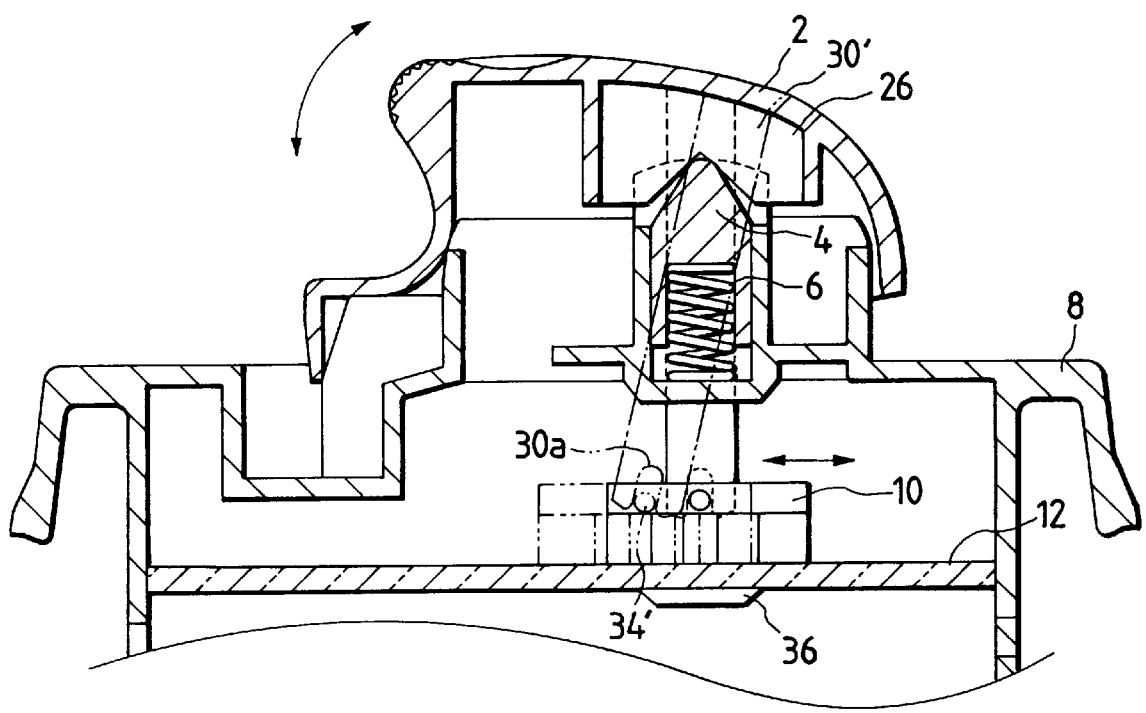
FIG. 27 is a cross sectional view which shows a modification of a switching apparatus.

FIG. 27 shows a modification of the switching apparatus.

The manual operating knob 2 includes a pair of plate arms 30' which extend downward, as viewed in the drawing, from side portions of the top inner wall of the manual operating knob 2. Each of the plate arms 30' has formed in its end a slit 30a into which one of pins 34' secured on side walls of the magnet 10 is inserted. The swing motion of the plate arms 30' causes the magnet 10 to be displaced horizontally on the printed circuit board 12 over the MRE 36.

Figure 28A:
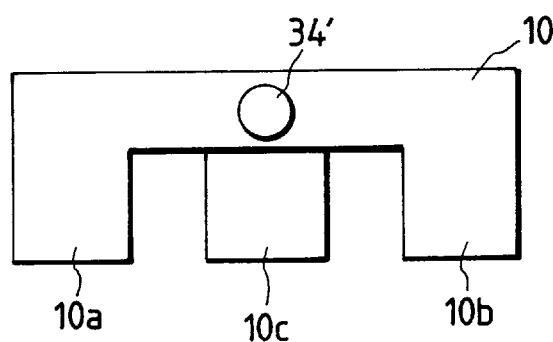
FIG. 28(a) is a front view which shows a magnet 10 used in the modification shown in FIG. 27.
Figure 28B:
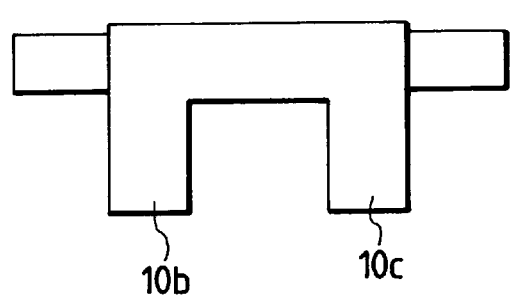
FIG. 28(b) is a side view of the magnet 10 shown in FIG. 28(a)
Figure 28C:
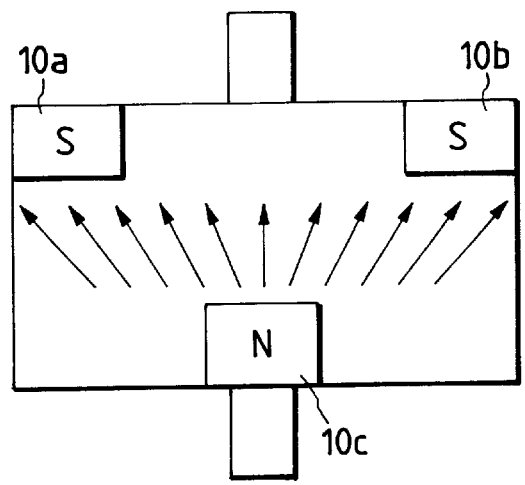
FIG. 28(c) is a bottom view of the magnet 10 shown in FIG. 28(a)

The magnet 10 has the structure, as shown in FIGS. 28(a) to 28(c), wherein end surfaces of the legs 10a to 10c are at the same level. The magnets, as shown in FIGS. 7(a) to 7(c) and 8(a) to 8(c), may alternatively be used by leveling end surfaces of the legs 10a to 10c with each other.

Figure 29:
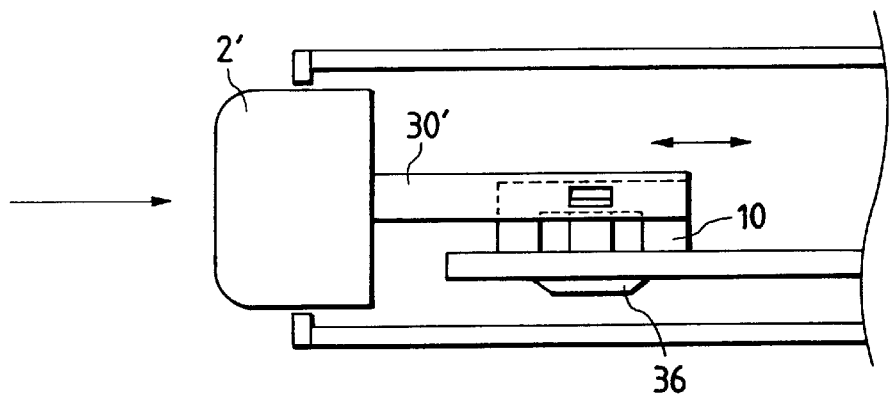
FIG. 29 is a cross sectional view which shows a second modification of a switching apparatus.

FIG. 29 shows a second modification of the switching apparatus which includes a manual operating knob 2' of a push button type. The manual operating knob 2' is urged by a spring (not shown) in the right direction, as viewed in the drawing. The depression of the manual operating knob 2 in the left direction causes the magnet 10 to be displaced horizontally through the plate arms 30' over the MRE 36 so that the resistance of the MRE 36 is changed.

Figure 30:
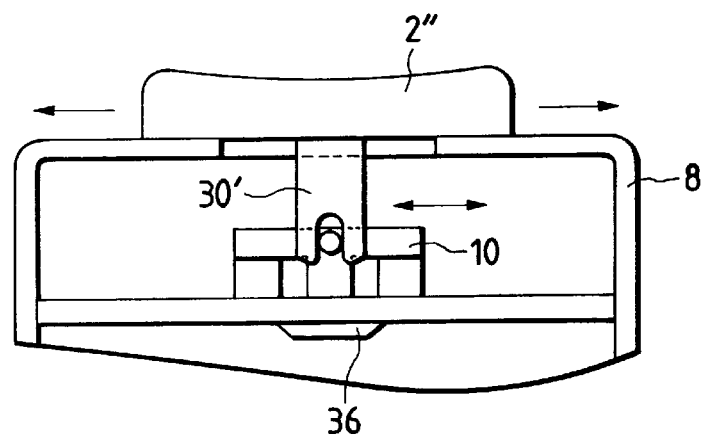
FIG. 30 is a cross sectional view which shows a third modification of a switching apparatus.

FIG. 30 shows a third modification of the switching apparatus which includes a manual operating knob 2" slidable on the housing 8 in a horizontal direction, as viewed in the drawing. The sliding movement of the knob 2" causes the magnet 10 to be displaced in the horizontal direction over the MRE 36 so that the resistance of the MRE 36 is changed.

Figure 31:
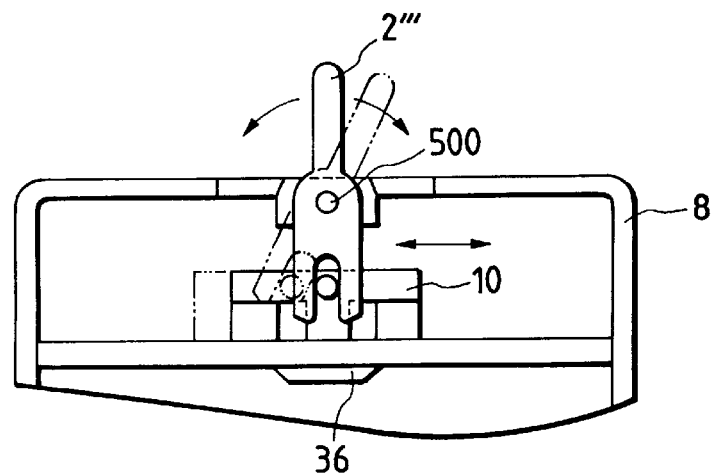
FIG. 31 is a cross sectional view which shows a fourth modification of a switching apparatus.

FIG. 31 shows a fourth modification of the switching apparatus which includes a switching lever 2'". The switching lever 2'" is pivotably supported by the housing 8 through a shaft 500 in engagement with the magnet 10. The pivotal movement of the switching lever 2'", as indicated by an arrow, causes the magnet 10 to be displaced horizontally over the MRE 36 so that the resistance of the MRE 36 is changed.

The switching apparatus, as described above, identifies the five operational positions of the manual operating knob 2 separately based on the variation in resistance of the MRE 36, however, may determine the position of the manual operating knob 2 continuously or more than five positions thereof separately using a linear portion of the output characteristics of the MRE 36.

Figure 32:
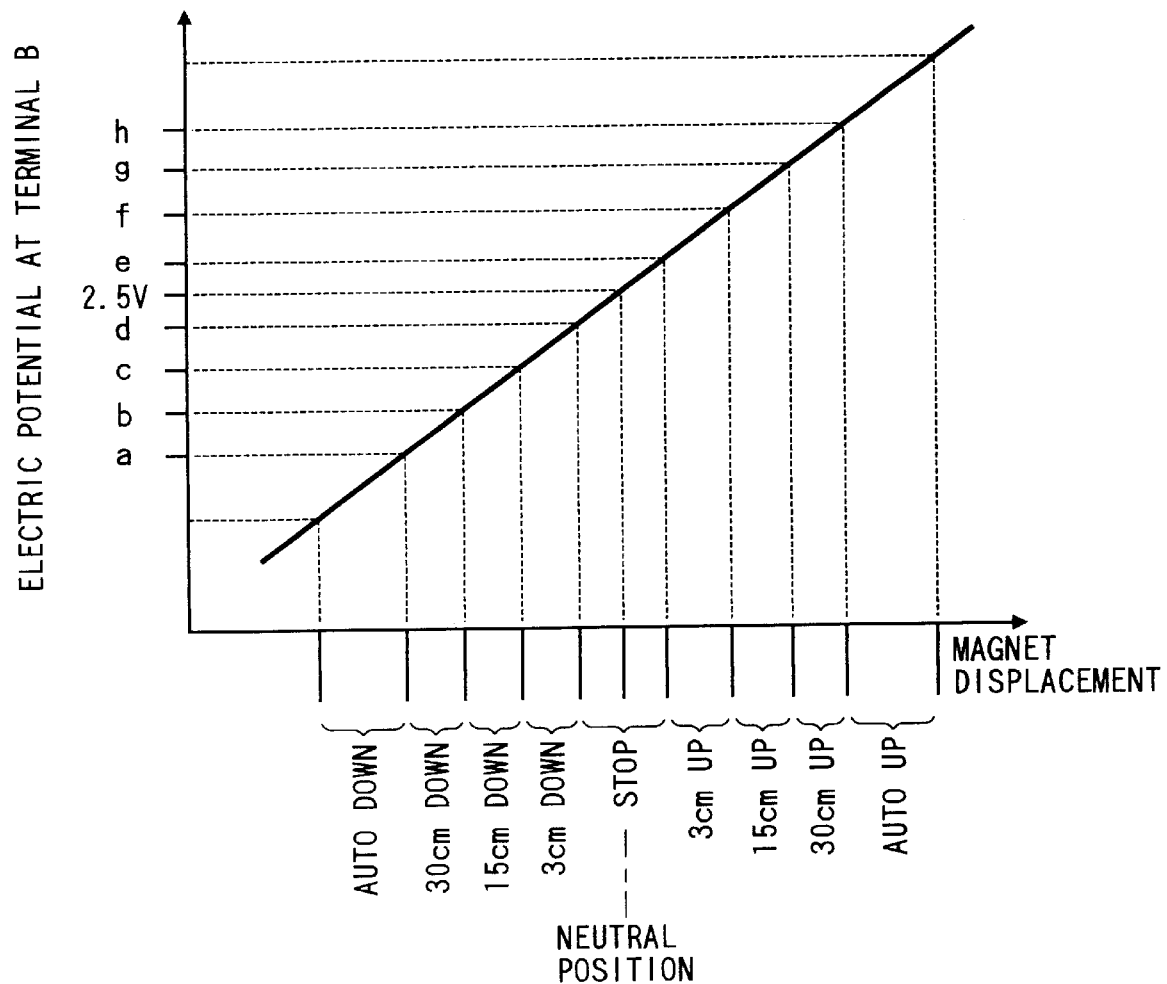
FIG. 32 is a graph which shows operational modes of a power window control system determined by the relation between an output electric potential of a magnetoresistive element and a displacement of a magnet when a displacement of a window is changed.

FIG. 32 shows the relation between an output electric potential of the MRE 36 and a displacement of the magnet 10 when nine operational positions of the manual operating knob 2 are detected.

When the output electric potential of the MRE 36 falls within a range from e to f, for example, according to movement of the manual operating knob 2, the microcomputer 102 provides a power window control signal to the motor driver 200 to lift up the window 3 cm. When the output electric potential of the MRE 36 falls within a range from f to g, for example, the microcomputer 102 provides a power window control signal to the motor driver 200 to lift up the window 15 cm.

The number of positions of the manual operating knob 2 to be detected may be increased further for fine adjustment of movement of the window.

Figure 33:
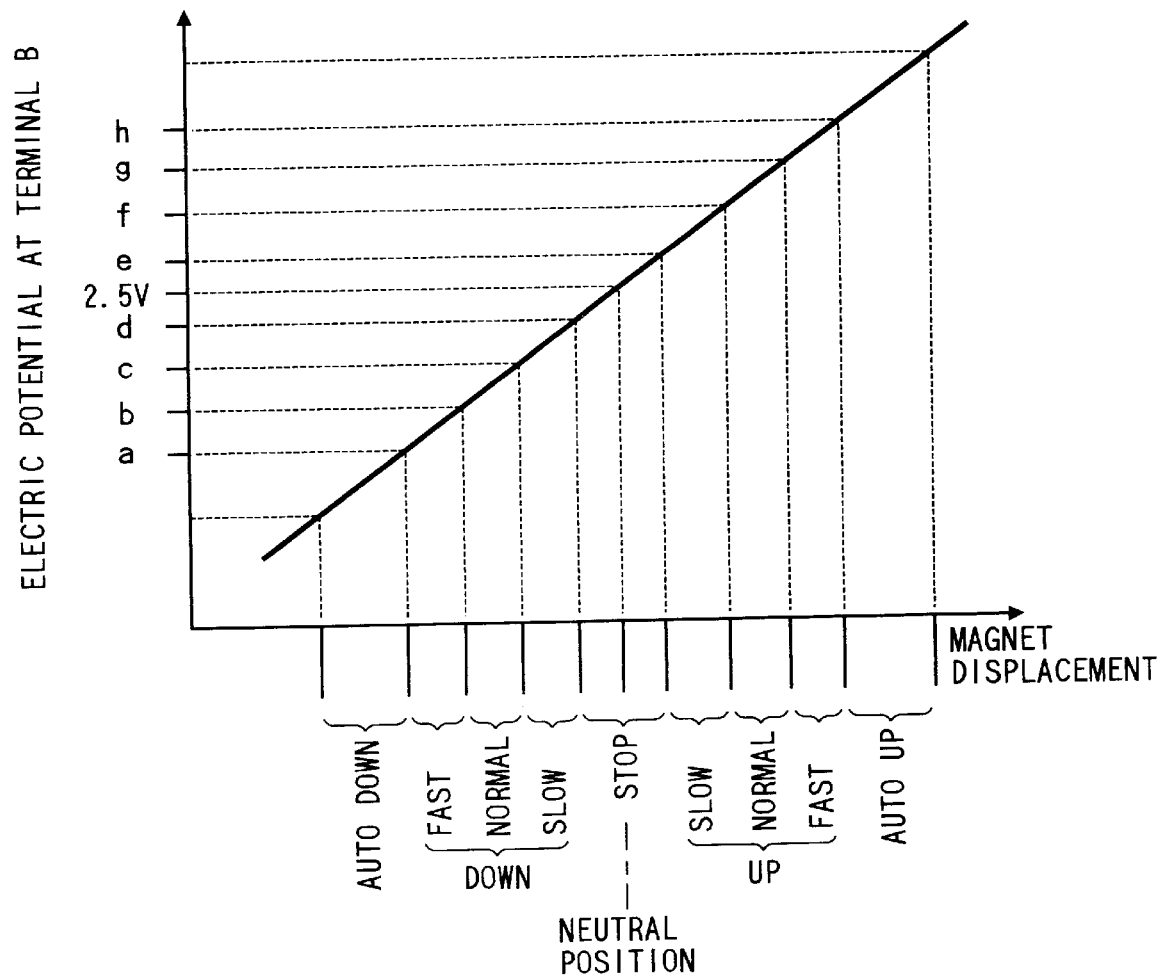
FIG. 33 is a graph which shows operational modes of a power window control system determined by the relation between an output electric potential of a magnetoresistive element and a displacement of a magnet when the speed of movement of a window is changed.

Instead of controlling the degree to which the window is opened or closed as shown in FIG. 32, the speed of movement of the window may be controlled as shown in FIG. 33.

For example, when the output electric potential of the MRE 36 falls within a range from e to f, according to movement of the manual operating knob 2, the microcomputer 102 provides a power window control signal to the motor driver 200 to lift up the window a given slow speed. When the output electric potential of the MRE 36 falls within a range from g to h, the microcomputer 102 provides a power window control signal to the motor driver 200 to lift up the window at a given high speed. When the output electric potential of the MRE 36 falls within a range from f to g, the microcomputer 102 provides a power window control signal to the motor driver 200 to lift up the window at a middle speed.

The speed control of the motor 300 may be achieved under PWM control using semiconductor switches such as power MOSFETs.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

For example, while in the above embodiments, the position of the manual operating knob 2 is determined by comparing the electric potentials appearing at the central points of the bridge circuits of the MRE 36 with the threshold values, it may be determined by monitoring the resistance of the MRE 36 cyclically to determine variations thereof and comparing these variations with threshold values.

What is claimed is:

1. A switching apparatus comprising;

an operating member movable within a preselected operational range;

a magnet that moves according to the movement of said operating member;

a magnetoresistive element placed in a magnetic field generated by said magnet, said magnetoresistive element changing its electrical resistance according to a variation in orientation of a magnetic flux applied to said magnetoresistive element resulting from the movement of said magnet, the magnetic flux produced radially over said magnetoresistive element;

wherein said magnetoresistive element includes first and second magnetoresistors which are connected in series to form a bridge circuit so that resistances of the first and second magnetoresistors change in opposite directions according to the movement of said magnet; and a position determining circuit measuring a change in electrical resistance of said magnetoresistive element to determine a position of said operating member within the given operational range and providing a signal indicative thereof.

2. A switching apparatus comprising:

an operating member moving within a preselected operational range;

a magnet moving according to the movement of said operating member;

a magnetoresistive element placed in a magnetic field applied from said magnet, said magnetoresistive element changing an electrical resistance thereof according to a variation in orientation of a magnetic flux applied to said magnetoresistive element resulting from the movement of said magnet;

a position determining circuit measuring a change in electric resistance of said magnetoresistive element to determine a position of said operating member within the given operational range and providing a signal indicative thereof;

wherein said magnetoresistive element includes first and second magnetoresistors which are connected in series to make up a bridge circuit so that resistances of the first and second magnetoresistors are changed in opposite directions according to the movement of said magnet; and wherein the first and second magnetoresistors are so connected that when an angle between the magnetic flux and the first magnetoresistor is increased according to the movement of said magnet, and vice versa, an angle between the magnet flux and the second magnetoresistor is decreased, and vice versa.

3. A switching apparatus comprising:

an operating member moving within a preselected operational range;

a magnet moving according to the movement of said operating member;

a magnetoresistive element placed in a magnetic field applied from said magnet, said magnetoresistive element changing an electrical resistance thereof according to a variation in orientation of a magnetic flux applied to said magnetoresistive element resulting from the movement of said magnet;

a position determining circuit measuring a change in electric resistance of said magnetoresistive element to determine a position of said operating member within the given operational range and providing a signal indicative thereof;

wherein said magnetoresistive element includes first and second magnetoresistors which are connected in series to make up a bridge circuit so that resistances of the first and second magnetoresistors are changed in opposite directions according to the movement of said magnet;

wherein the first and second magnetoresistors are so connected that when an angle between the magnetic flux and the first magnetoresistor is increased according to the movement of said magnet, and vice versa, an angle between the magnet flux and the second magnetoresistor is decreased, and vice versa; and wherein said magnet includes first, second, and third magnetic portions, the first and second magnetic portions being magnetized to have one of north and south poles, the third magnetic portion being magnetized to have the other of the north and south poles.

4. A switching apparatus comprising:

an operating member moving within a preselected operational range;

a magnet moving according to the movement of said operating member;

a magnetoresistive element placed in a magnetic field applied from said magnet, said magnetoresistive element changing an electrical resistance thereof according to a variation in orientation of a magnetic flux applied to said magnetoresistive element resulting from the movement of said magnet;

a position determining circuit measuring a change in electric resistance of said magnetoresistive element to determine a position of said operating member within the given operational range and providing a signal indicative thereof; and wherein said magnetoresistive element includes a plurality of bridge circuits each of which develops a given level of electric potential in a preselected position relation to said magnet, and wherein said position determining circuit determines the position of said operating member based on levels of the electric potentials developed at the bridge circuits.

5. A switching apparatus as set forth in claim 4 wherein said position determining circuit selects one from the bridge circuits which develops the given level of the electric potential to determine the position of said operating member.

6. A switching apparatus comprising;

an operating member movable within a preselected operational range;

a magnet that moves according to the movement of said operating member;

a magnetoresistive element placed in a magnetic field generated by said magnet, said magnetoresistive element changing its electrical resistance according to a variation in orientation of a magnetic flux applied to said magnetoresistive element resulting from the movement of said magnet, the magnetic flux produced radially over said magnetoresistive element;

wherein said magnetoresistive element includes first and second magnetoresistors, the magnetoresistors connected in series to form a bridge circuit; and a position determining circuit measuring a change in electrical resistance of said magnetoresistive element to determine a position of said operating member within the given operational range and providing a signal indicative thereof;

wherein said position determining circuit compares the electrical potential appearing at a junction of the first and second magnetoresistors with reference values to determine the position of said operating member; and wherein each of the reference values corresponds to one of switching positions of said operating member which are preselected within the preselected operational range, and wherein said position determining circuit selects one of the switching positions corresponding to the position of said operating member based on results of comparison of the levels of the electrical potentials with the reference values.

7. A switching apparatus comprising;

an operating member movable within a preselected operational range and designed to be kept at one of a plurality of switching positions;

a magnet that moves according to the movement of said operating member;

a magnetoresistive element placed in a magnetic field generated by said magnet, said magnetoresistive element changing its electrical resistance according to a variation in orientation of a magnetic flux applied to said magnetoresistive element resulting from the movement of said magnet, the magnetic flux produced radially over said magnetoresistive element;

wherein said magnetoresistive element includes first and second magnetoresistors connected in series to form a bridge circuit; and a position determining circuit measuring a change in electrical resistance of said magnetoresistive element to determine a position of said operating member within the given operational range and providing a signal indicative thereof;

wherein said position determining circuit compares the electrical potential appearing at a junction of the first and second magnetoresistors with reference values to determine the position of said operating member;

wherein each of the reference values corresponds to one of the plurality of switching positions of said operating member which are preselected within the preselected operational range; and wherein said position determining circuit selects one of the plurality of switching positions corresponding to the position of said operating member based on results of comparison of the levels of the electrical potentials with the reference values.

8. A switching apparatus as set forth in claim 5 wherein each of the reference values is determined based on the electric potential developed at said magnetoresistive element when said operating member is in inoperative position.

9. A switching apparatus as set forth in claim 8 wherein each of the reference values is determined based on a difference between the electric potential developed at said magnetoresistive element when said operating member is in the operative position and the electric potential developed at said magnetoresistive element when said operating member reaches a given position within the preselected operational range.

10. A switching apparatus comprising:

an operating member movable within a preselected operational range;

a magnet that moves according to the movement of said operating member;

a magnetoresistive element placed in a magnetic field generated by said magnet, said magnetoresistive element changing its electrical resistance according to a variation in orientation of a magnetic flux applied to said magnetoresistive element resulting from the movement of said magnet, the magnetic flux produced radially over said magnetoresistive element;

a printed circuit board having said magnetoresistive element mounted on a first surface thereof opposite a second surface, the second surface facing said magnet;

wherein said position determining circuit is mounted on the second surface; and a position determining circuit measuring a change in electrical resistance of said magnetoresistive element to determine a position of said operating member within the given operational range and providing a signal indicative thereof.

11. A power window control apparatus comprising:

an operating member movable within a preselected operational range;

a magnet that moves according to the movement of the operating member;

a magnetoresistive element placed in a magnetic field generated by the magnet, the magnetoresistive element changing its electrical resistance according to a variation in orientation of a magnetic flux applied to the magnetoresistive element resulting from the movement of the magnet, the magnetic flux produced radially over said magneto resistive element;

a position determining circuit measuring the electrical resistance of said magnetoresistive element to determine a position of said operating member within the given operational range and providing a signal indicative thereof; and a control circuit responsive to the signal from said position determining circuit to control movement of the window wherein said position determining circuit compares the electrical resistance of said magnetoresistive element with a plurality of reference values to determine the position of said operating member, and wherein said control circuit selects one from a plurality of operational modes according to a result of the comparison to control the movement of the window in the selected one of the operational modes.

12. A power window control apparatus comprising:

an operating member movable within a preselected operational range;

a magnet that moves according to the movement of said operating member;

a magnetoresistive element placed in a magnetic field generated by said magnet, said magnetoresistive element changing its electrical resistance according to a variation in orientation of a magnetic flux applied to said magnetoresistive element resulting from the movement of said magnet, the magnetic flux produced radially over said magnetoresistive element;

a position determining circuit measuring the electric resistance of said magnetoresistive element to determine a position of said operating member within the given operational range and providing a signal indicative thereof; and a control circuit responsive to the signal from said position determining circuit and to control speed of movement of the window according to the selected one of the operational modes.

13. A switching apparatus as set forth in claim 5 wherein said magnetoresistive element includes a plurality of magnetoresistors connected in series of which two adjacent magnetoresistors make up one of the bridge circuits, and wherein said position determining circuits monitors electric potentials at junctions of the magnetoresistors to determine the position of said operating member.

14. A switching apparatus comprising:

an operating member movable within a preselected operational range;

a magnet that moves according to the movement of the operating member;

wherein the magnet includes first, second, and third magnetic portions, the first and second magnetic portions being magnetized to have one of north and south poles, the third magnetic portion being magnetized to have the other of the north and south poles;

a magnetoresistive element placed in a magnetic field generated by the magnet, the magnetoresistive element changing its electrical resistance according to a variation in orientation of a magnetic flux applied to the magnetoresistive element resulting from the movement of the magnet; and a position determining circuit measuring a change in electrical resistance of the magnetoresistive element to determine a position of the operating member within the preselected operational range and providing a signal indicative thereof.

15. A switching apparatus comprising:

an operating member movable within a preselected operational range;

a magnet movable according to movement of the operating member;

wherein the magnet includes first, second, and third magnetic portions, the first and second magnetic portions being magnetized to have one of the north and south poles, the third magnetic portion being magnetized to have the other of the north and south poles;

a magnetoresistive element formed on a surface of a circuit board in a given wiring pattern and placed in a magnetic field generated by the magnet, the magnetoresistive element changing its electrical resistance according to a variation in orientation of a magnetic flux applied to the magnetoresistive element resulting from movement of the magnet;

wherein the magnetic flux (i) extends radially in a plane positioned parallel to the surface of the circuit board, (ii) extends radially across a center line, the center line extending perpendicular to the movement of the operating member, and (iii) is produced by north and south poles which are provided on the magnet and aligned to traverse an operating direction; and a position determining circuit measuring a change in electrical resistance of the magnetoresistive element to determine a position of the operating member within the preselected operational range and providing a signal indicative thereof.

16. A switching apparatus comprising:

an operating member (i) movable within a preselected operational range and (ii) designed to be kept at a given one of a plurality of switching positions defined within the preselected operational range;

a magnet movable according to movement of said operating member;

a magnetoresistive element placed in a magnetic field generated by said magnet, said magnetoresistive element changing its electrical resistance according to a variation in orientation of a magnetic flux applied to said magnetoresistive element resulting from movement of said magnet, the magnetic flux produced radially over said magnetoresistive element;

wherein said magnetoresistive element includes first and second magnetoresistors connected in series and forming a bridge circuit so that resistances of the first and second magnetoresistors change in opposite directions according to the movement of said magnet; and a position determining circuit measuring a change in electrical resistance of said magnetoresistive element to determine a position of said operating member within the given operational range and providing a signal indicative thereof.

17. A switching apparatus comprising;

an operating member movable within a preselected operational range;

a magnet movable according to the movement of said operating member;

a magnetoresistive element placed in a magnetic field generated by said magnet, said magnetoresistive element changing its electrical resistance according to a variation in orientation of a magnetic flux applied to said magnetoresistive element resulting from movement of said magnet, the magnetic flux produced radially over said magnetoresistive element;

wherein said magnetoresistive element (i) includes first and second magnetoresistors connected in series and forming a bridge circuit so that resistances of the first and second magnetoresistors change in opposite directions according to the movement of said magnet and (ii) is mounted on a first surface of a printed circuit board, the first surface being positioned opposite a second surface, the second surface facing said magnet; and a position determining circuit measuring a change in electrical resistance of said magnetoresistive element to determine a position of said operating member within the given operational range and providing a signal indicative thereof.

* * * * *

UNITED STATES PATENT AND TRADEMARK OFFICE
CERTIFICATE OF CORRECTION

PATENT NO.     : 6,150,808
DATED          : November 21, 2000
INVENTOR(S)    : YAGYU et al.

It is certified that error appears in the above-identified patent and that said Letters Patent is hereby corrected as shown below:

On the Face of the Patent

[75] Inventors:
        Change "Tokoi" to --Tokai--

Signed and Sealed this

First Day of May, 2001

Attest:

NICHOLAS P. GODICI

*Attesting Officer*     *Acting Director of the United States Patent and Trademark Office*